US008176384B2

(12) United States Patent
Myung et al.

(10) Patent No.: US 8,176,384 B2
(45) Date of Patent: May 8, 2012

(54) METHOD AND APPARATUS FOR CHANNEL ENCODING AND DECODING IN A COMMUNICATION SYSTEM USING LOW-DENSITY-PARITY-CHECK CODES

(75) Inventors: Seho Myung, Suwon-si (KR); Hwan-Joon Kwon, Suwon-si (KR); Kyung-Joong Kim, Pohang-si (KR); Kyeong-Cheol Yang, Seoul (KR); Hyun-Koo Yang, Seoul (KR); Jae-Yoel Kim, Suwon-si (KR); Hak-Ju Lee, Incheon (KR)

(73) Assignees: Samsung Electronics Co., Ltd (KR); Postech Academy Industry Foundation (KR)

( * ) Notice: Subject to any disclaimer, the term of this patent is extended or adjusted under 35 U.S.C. 154(b) by 707 days.

(21) Appl. No.: 12/393,670

(22) Filed: Feb. 26, 2009

(65) Prior Publication Data

US 2009/0217129 A1  Aug. 27, 2009

(30) Foreign Application Priority Data

Feb. 26, 2008 (KR) ........................ 10-2008-0017279
Mar. 11, 2008 (KR) ........................ 10-2008-0022484
Mar. 18, 2008 (KR) ........................ 10-2008-0025144

(51) Int. Cl.
*G06F 11/00* (2006.01)
(52) U.S. Cl. ....................................... 714/758
(58) Field of Classification Search .................... 714/758
See application file for complete search history.

(56) References Cited

U.S. PATENT DOCUMENTS

2005/0166132 A1  7/2005  Shen et al.
2005/0283708 A1 12/2005 Kyung et al.
2007/0022354 A1  1/2007  Yu et al.
2007/0033486 A1  2/2007  Hong et al.
2007/0089025 A1  4/2007  Hong et al.
2007/0094580 A1  4/2007  Livshitz
2007/0143656 A1  6/2007  Niu et al.
2007/0162814 A1  7/2007  Shen et al.

(Continued)

FOREIGN PATENT DOCUMENTS

EP            1 788 709          5/2007

(Continued)

OTHER PUBLICATIONS

Xu, Yin et al. "Improving Shortening Algorithm for Irregular QC-LDPC Codes Using Known Bits" IEEE 2010.*

(Continued)

*Primary Examiner* — Bryce Bonzo
(74) *Attorney, Agent, or Firm* — The Farrell Law Firm, P.C.

(57) ABSTRACT

A method and apparatus for encoding and decoding a channel in a communication system using a Low-Density Parity-Check (LDPC) code. The encoding method includes determining a modulation scheme for transmitting a symbol; determining a shortening pattern in consideration of the determined modulation scheme; grouping columns corresponding to an information word in a parity-check matrix of the LDPC code into a plurality of column groups; ordering the column groups; determining a range of a resulting information word desired to be obtained by shortening the information word; based on the range of the resulting information word, performing column group-by-column group shortening on the ordered column groups of the information word, according to the determined shortening pattern; and LDPC-encoding the shortened information word.

37 Claims, 12 Drawing Sheets

U.S. PATENT DOCUMENTS

| | | |
|---|---|---|
| 2007/0226583 A1 | 9/2007 | Kim et al. |
| 2009/0259915 A1* | 10/2009 | Livshitz et al. ............... 714/758 |
| 2009/0290544 A1 | 11/2009 | Yano et al. |
| 2010/0115372 A1* | 5/2010 | Trachewsky et al. ......... 714/752 |
| 2011/0119568 A1* | 5/2011 | Jeong et al. ................... 714/790 |
| 2011/0276855 A1* | 11/2011 | Jeong et al. ................... 714/752 |

FOREIGN PATENT DOCUMENTS

| | | |
|---|---|---|
| EP | 1 837 999 | 9/2007 |
| EP | 1 868 294 | 12/2007 |
| KR | 1020050118056 | 12/2005 |
| KR | 1020070009244 | 1/2007 |
| KR | 1020070034904 | 3/2007 |
| KR | 1020070054088 | 5/2007 |
| RU | 2 308 803 | 10/2007 |
| WO | WO 2006/079081 | 7/2006 |
| WO | WO 2007/080727 | 7/2007 |

OTHER PUBLICATIONS

Tao Tian et al. : "Construction of Rate-Compatible LDPC Codes Utilizing Information Shortening and Parity Puncturing", EURASIP Journal on Wireless Communications and Networking, 2005.

* cited by examiner $$H_1 = \begin{bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix}$$

FIG. 4
(RELATED ART)

METHOD AND APPARATUS FOR CHANNEL ENCODING AND DECODING IN A COMMUNICATION SYSTEM USING LOW-DENSITY-PARITY-CHECK CODES

PRIORITY

This application claims priority under 35 U.S.C. §119(a) to a Korean Patent Application filed in the Korean Intellectual Property Office on Feb. 26, 2008 and assigned Serial No. 10-2008-0017279, a Korean Patent Application filed in the Korean Intellectual Property Office on Mar. 11, 2008 and assigned Serial No. 10-2008-0022484, and a Korean Patent Application filed in the Korean Intellectual Property Office on Mar. 18, 2008 and assigned Serial No. 10-2008-0025144, the disclosures of all of which are incorporated herein by reference.

BACKGROUND OF THE INVENTION

1. Field of the Invention

The present invention relates generally to a communication system using Low-Density Parity-Check (LDPC) codes, and more particularly, to a channel encoding/decoding apparatus and method for generating LDPC codes having various codeword lengths and code rates from an LDPC code given in a high-order modulation scheme.

2. Description of the Related Art

In wireless communication systems, link performance significantly decreases due to various noises in the channels, a fading phenomenon, and Inter-Symbol Interference (ISI). Therefore, in order provide high-speed digital communication systems, which require high data throughput and reliability, such as the next-generation mobile communication, digital broadcasting, and portable internet, it is important to develop technologies for overcoming the channel noises, fading, and ISI. Recently, an intensive study of an error-correcting code has been conducted as a method for increasing communication reliability by efficiently recovering distorted information.

The LDPC code, i.e., a type of error-correcting code, is generally defined as a parity-check matrix, and can be represented using a bipartite graph, which is referred to as a Tanner graph. The bipartite graph means that vertexes constituting the graph are divided into two different types, and the LDPC code is represented with the bipartite graph composed of vertexes, some of which are called variable nodes and the other of which are called check nodes. The variable nodes are one-to-one mapped to the encoded bits.

FIG. 1 illustrates an example of a parity-check matrix $H_1$ of the LDPC code having 4 rows and 8 columns.

Referring to FIG. 1, because the number of columns is 8, the parity-check matrix $H_1$ is an LDPC code that generates a length-8 codeword, and the columns are mapped to 8 encoded bits.

FIG. 2 illustrates a Tanner graph corresponding to the parity-check matrix $H_1$ of FIG. 1.

Referring to FIG. 2, the Tanner graph of the LDPC code includes 8 variable nodes $x_1$ (202), $x_2$ (204), $x_3$ (206), $x_4$ (208), $x_5$ (210), $x_6$ (212), $x_7$ (214), and $x_8$ (216), and 4 check nodes 218, 220, 222, and 224. An $i^{th}$ column and a $j^{th}$ row in the parity-check matrix $H_1$ of the LDPC code are mapped to a variable node $x_i$ and a $j^{th}$ check node, respectively. In addition, a value of 1, i.e., a non-zero value, at the point where an $i^{th}$ column and a $j^{th}$ row in the parity-check matrix $H_1$ of the LDPC code cross each other, indicates that there is an edge between the variable node $x_i$ and the $j^{th}$ check node on the Tanner graph as illustrated in FIG. 2.

In the Tanner graph of the LDPC code, a degree of the variable node and the check node indicates the number of edges connected to each respective node, and the degree is equal to the number of non-zero entries in a column or row corresponding to the pertinent node in the parity-check matrix of the LDPC code. For example, in FIG. 2, degrees of the variable nodes $x_1$ (202), $x_2$ (204), $x_3$ (206), $x_4$ (208), $x_5$ (210), $x_6$ (212), $x_7$ (214), and $x_8$ (216) are 4, 3, 3, 3, 2, 2, 2, and 2, respectively, and degrees of check nodes 218, 220, 222, and 224 are 6, 5, 5, and 5, respectively. In addition, the numbers of non-zero entries in the columns of the parity-check matrix $H_1$ of FIG. 1, which correspond to the variable nodes of FIG. 2, coincide with their degrees 4, 3, 3, 3, 2, 2, 2, and 2, respectively, and the numbers of non-zero entries in the rows of the parity-check matrix $H_1$ of FIG. 1, which correspond to the check nodes of FIG. 2, coincide with their degrees 6, 5, 5, and 5, respectively.

In order to express degree distribution for the nodes of the LDPC code, a ratio of the number of degree-i variable nodes to the total number of variable nodes is defined as $f_i$, and a ratio of the number of degree-j check nodes to the total number of check nodes is defined as $g_j$. For example, for the LDPC code corresponding to FIGS. 1 and 2, $f_2=4/8$, $f_3=3/8$, $f_4=1/8$, and $f_i=0$ for $i\neq 2,3,4$; and $g_5=3/4$, $g_6=1/4$, and $g_j=0$ for $j\neq 5,6$. When a length of the LDPC code, i.e., the number of columns, is defined as N, and the number of rows is defined as N/2, the density of non-zero entries in the entire parity-check matrix having the above degree distribution is computed as shown Equation (1).

$$\frac{2f_2 N + 3f_3 N + 4f_4 N}{N \cdot N/2} = \frac{5.25}{N} \quad (1)$$

In Equation (1), as N increases, the density of 1's in the parity-check matrix decreases. Generally, as for the LDPC code, because the codeword length N is inversely proportional to the density of non-zero entries, the LDPC code with a large N has a very low density of non-zero entries. The term "low-density" in the name of the LDPC code originates from the above-mentioned relationship.

FIG. 3 schematically illustrates an LDPC code adopted as the standard technology in Digital Video Broadcasting-Satellite transmission $2^{nd}$ generation (DVB-S2), which is one of the European digital broadcasting standards.

In FIG. 3, $N_1$ and $K_1$ denote a codeword length and an information length (or length of information word) of an LDPC code, respectively, and $(N_1-K_1)$ provides a parity length. Further, integers $M_1$ and q satisfy $q=(N_1-K_1)/M_1$. Preferably, $K_1/M_1$ is an integer.

Referring to FIG. 3, a structure of a parity part, i.e., $K_1^{th}$ column through $(N_1-1)^{th}$ column, in the parity-check matrix, has a dual diagonal shape. Therefore, as for degree distribution over columns corresponding to the parity part, all columns have a degree of 2, except for the last column having a degree of 1.

In the parity-check matrix, an information part, i.e., $0^{th}$ column through $(K_1-1)^{th}$ column, is created using the following rules.

Rule 1: A total of $K_1/M_1$ column groups is generated by grouping $K_1$ columns corresponding to the information word in the parity-check matrix into multiple groups each including $M_1$ columns. A method for forming columns belonging to each column group follows Rule 2 below.

Rule 2: First, positions of 1's in each $0^{th}$ column in $i^{th}$ column groups (where $i=1,\ldots,K_1/M_1$) are determined. When a degree of a $0^{th}$ column in each $i^{th}$ column group is denoted by $D_i$, if positions of rows with 1 are assumed to be $R_{i,0}^{(1)}, R_{i,0}^{(2)}, \ldots, R_{i,0}^{D_i}$, positions $R_{i,j}^{(k)}$ ($k=1,2,\ldots,D_i$) of rows with 1 are defined as shown in Equation (2), in a $j^{th}$ column (where $j=1,2,\ldots,M_1-1$) in an $i^{th}$ column group.

$$R_{i,j}^{(k)} = R_{i,(j-1)}^{(k)} + q \bmod(N_1-K_1),$$

$$k=1,2,\ldots,D_i, i=1,\ldots,K_1/M_1, j=1,\ldots,M_1-1 \quad (2)$$

According to the above rules, it can be appreciated that degrees of columns belonging to an $i^{th}$ column group are all equal to $D_i$. For a better understanding of a structure of a DVB-S2 LDPC code that stores information on the parity-check matrix according to the above rules, the following more detailed example will be given.

As a detailed example, for $N_1=30$, $K_1=15$, $M_1=5$, and $q=3$, three sequences for the information on the positions of rows with 1 for $0^{th}$ columns in 3 column groups can be expressed as follows. Herein, these sequences are referred to as "weight-1 position sequences."

$$R_{1,0}^{(1)}=0, R_{1,0}^{(2)}=1, R_{1,0}^{(3)}=2,$$

$$R_{2,0}^{(1)}=0, R_{2,0}^{(2)}=11, R_{2,0}^{(3)}=13,$$

$$R_{3,0}^{(1)}=0, R_{3,0}^{(2)}=10, R_{3,0}^{(3)}=14.$$

Regarding the weight-1 position sequence for $0^{th}$ columns in each column group, only the corresponding position sequences can be expressed as follows for each column group. For example:

0 1 2

0 11 13

0 10 14.

That is, the $i^{th}$ weight-1 position sequence in the $i^{th}$ line sequentially represents the information on the positions of rows with 1 for the $i^{th}$ column group.

It is possible to generate an LDPC code having the same concept as that of a DVB-S2 LDPC code illustrated FIG. 4, by forming a parity-check matrix using the information corresponding to the detailed example, and Rules 1 and 2.

It is known that the DVB-S2 LDPC code designed in accordance with Rules 1 and 2 can be efficiently encoded using the structural shape. Respective steps in a process of performing LDPC encoding using the DVB-S2 based parity-check matrix will be described below by way of example.

In the following description, as a detailed example, a DVB-S2 LDPC code with $N_1=16200$, $K_1=10800$, $M_1=360$, and $q=15$ undergoes an encoding process. For convenience, information bits having a length $K_1$ are represented as $(i_0, i_1,\ldots,i_{K_1-1})$, and parity bits having a length $(N_1-K_1)$ are expressed as $(p_0, p_1,\ldots,p_{N_1-K_1-1})$.

Step 1: An LDPC encoder initializes parity bits as follows:
$p_0 = p_1 = \ldots = p_{N_1-K_1-1} = 0$ Step 2: The LDPC encoder reads information on rows where a 1 is located in a column group from a $0^{th}$ weight-1 position sequence out of the stored sequences indicating the parity-check matrix.

0 2084 1613 1548 1286 1460 3196 4297 2481 3369 3451 4620 2622

$$R_{1,0}^{(1)}=0, R_{1,0}^{(2)}=2048, R_{1,0}^{(3)}=1613, R_{1,0}^{(4)}=1548, R_{1,0}^{(5)}=1286,$$

$$R_{1,0}^{(6)}=1460, R_{1,0}^{(7)}=3196, R_{1,0}^{(8)}=4297, R_{1,0}^{(9)}=2481, R_{1,0}^{(10)}=3369,$$

$$R_{1,0}^{(11)}=3451, R_{1,0}^{(12)}=4620, R_{1,0}^{(13)}=2622.$$

The LDPC encoder updates particular parity bits $p_x$ in accordance with Equation (3), using the read information and the first information bit $i_0$. Herein, x is a value of $R_{1,0}^{(k)}$ for $k=1, 2, \ldots, 13$.

$$p_0 = p_0 \oplus i_0, p_{2084} = p_{2064} \oplus i_0, p_{1613} = p_{1613} \oplus i_0,$$

$$p_{1548} = p_{1548} \oplus i_0, p_{1286} = p_{1286} \oplus i_0, p_{1460} = p_{1460} \oplus i_0,$$

$$p_{3196} = p_{3196} \oplus i_0, p_{4297} = p_{4297} \oplus i_0, p_{2481} = p_{2481} \oplus i_0, \quad (3)$$

$$p_{3369} = p_{3369} l \oplus i0, p_{3451} = p_{3451} \oplus i_0, p_{4620} \oplus i_0,$$

$$p_{2622} = p_{2622} \oplus i_0$$

In Equation (3), $p_x = p_x \oplus i_0$ can also be expressed as $p_x \leftarrow p_x \oplus i_0$, and $\oplus$ represents binary addition.

Step 3: The LDPC encoder determines a value of Equation (4) for the next 359 information bits $i_m$ (where $m=1, 2, \ldots, 359$) after $i_0$.

$$\{x+(m \bmod M_1) \times q\} \bmod(N_1-K_1), M_1=360, m=1,2,\ldots,359 \quad (4)$$

In Equation (4), x is a value of $R_{1,0}^{(k)}$ for $k=1,2,\ldots,13$. It should be noted that Equation (4) has the same concept as Equation (2).

Next, the LDPC encoder performs an operation similar to Equation (3) using the values found in Equation (4). That is, the LDPC encoder updates parity bits $P_{\{x+(m \bmod M_1) \times q\} \bmod(N_1-K_1)}$ for $i_m$. For example, for $m=1$, i.e., for $i_1$, the LDPC encoder updates parity bits $p_{(x+q) \bmod (N1-K_1)}$ as defined in Equation (5).

$$p_{15} = p_{15} \oplus i_1, p_{2099} = p_{2099} \oplus i_1, p_{1628} = p_{1628} \oplus i_1,$$

$$p_{1563} = p_{1563} \oplus i_1, p_{1301} = p_{1301} \oplus i_1, p_{1475} = p_{1475} \oplus i_1,$$

$$p_{3211} = p_{3211} \oplus i_1, p_{4312} = p_{4312} \oplus i_1, p_{2496} = p_{2496} \oplus i_1, \quad (5)$$

$$p_{3384} = p_{3384} \oplus i_1, p_{3466} = p_{3466} \oplus i_1, p_{4635} = p_{4635} \oplus i_1,$$

$$p_{2637} = p_{2637} \oplus i_1$$

In Equation (5), $q=15$. The LDPC encoder performs the above process for $m=1, 2, \ldots, 359$, in the same manner as described above.

Step 4: As in Step 2, the LDPC encoder reads information of the $1^{st}$ weight-1 position sequence $R_{2,0}^{(k)}$ ($k=1, 2, \ldots, 13$) for a $361^{st}$ information bit $i_{360}$, and updates a particular $p_x$, where x is $R_{2,0}^{(k)}$. The LDPC encoder updates $p_{\{x+(m \bmod M_1) \times q\} \bmod(N_1-K_1)}$, $m=361, 362, \ldots, 719$ by similarly applying Equation (4) to the next 359 information bits $i_{361}, i_{362}, \ldots, i_{719}$ after $i_{360}$.

Step 5: The LDPC encoder repeats Steps 2, 3, and 4 for all groups each having 360 information bits.

Step 6: The LDPC encoder finally determines parity bits using Equation (6).

$$p_i = p_i \oplus p_{i-1}, i=1,2,\ldots,N_1-K_1-1 \quad (6)$$

The parity bits $p_i$ of Equation (6) have undergone LDPC encoding.

As described above, DVB-S2 performs encoding as described in Steps 1 to 6.

In order to apply the LDPC code to the actual communication system, the LDPC code should be designed to be suitable for the data rate required in the communication system. Particularly, LDPC codes having various codeword lengths are needed to support various data rates according to the system requirements in an adaptive communication system employing Hybrid Automatic Retransmission reqQuest (HARQ) and Adaptive Modulation and Coding (AMC), and also in a communication system supporting various broadcast services.

However, as described above, the LDPC code used in the DVB-S2 system has only two types of codeword lengths due to its limited use, and each type of the LDPC code uses an independent parity-check matrix. Accordingly, there is a long-felt need in the art for a method for supporting various codeword lengths to increase extendibility and flexibility of the system. Particularly, in the DVB-S2 system, transmission of data having several hundreds to thousands of bits is needed for transmitting signaling information. However, because only 16200 and 64800 are available for a length of the DVB-S2 LDPC code, there is still a need for support of various codeword lengths. However, because storing independent parity-check matrixes for respective codeword lengths of the LDPC code may reduce memory efficiency, there is also a need for a scheme capable of efficiently supporting various codeword lengths from the existing parity-check matrix, without requiring a new parity-check matrix.

It is noted that reliabilities of bits included in high-order modulation symbols are different when high-order modulation is used in the communication system requiring an LDPC code with various codeword lengths, unlike when the high-order modulation is applied in the communication system employing only Binary Phase Shift Keying (BPSK) or Quadrature Phase Shift Keying (QPSK).

In order to demonstrate the reliability difference in high-order modulation, a description will now be made below as to signal constellations for Quadrature Amplitude Modulation (QAM), which is high-order modulation commonly used in communication systems. A QAM-modulated symbol includes a real part and an imaginary part, and various modulation symbols can be generated by differentiating magnitudes and signs of their real parts and imaginary parts. QAM will be described together with QPSK modulation in order to more clearly provide the details of QAM characteristics.

FIG. 5A schematically illustrates a signal constellation for a conventional QPSK modulation.

Referring to FIG. 5A, $y_0$ determines a sign of a real part while $y_1$ determines a sign of an imaginary part. That is, a sign of the real part is plus (+) for $y_0=0$, and minus (−) for $y_0=1$. Also, a sign of the imaginary part is plus (+) for $y_1=0$, and minus (−) for $y_1=1$. Because $y_0$ and $y_1$ are equal in error occurrence probability, as they are sign indication bits that respectively indicate signs of the real part and the imaginary part, reliabilities of $(y_0, y_1)$ bits corresponding to one modulation signal are equal in QPSK modulation. For $y_{0,q}$ and $y_{1,q}$, the second subscript index q indicates a $q^{th}$ output of bits included in a modulation signal.

FIG. 5B schematically illustrating a signal constellation for a conventional 16-QAM modulation.

Referring to FIG. 5B, $(y_0, y_1, y_2, y_3)$ correspond to bits of one modulation signal. More specifically, bits $y_0$ and $y_2$ determine a sign and a magnitude of the real part, respectively, while bits $y_1$ and $y_3$ determine a sign and a magnitude of the imaginary part, respectively. That is, $y_0$ and $y_1$ determine signs of the real part and imaginary part of the modulation signal, while $y_2$ and $y_3$ determine magnitudes of the real part and imaginary part of the modulation signal. Because distinguishing a sign of a modulated signal is easier than distinguishing a magnitude of the modulated signal, $y_2$ and $y_3$ are higher in error occurrence probability than $y_0$ and $y_1$. Therefore, in terms of non-error occurrence probabilities (i.e., reliabilities) of the bits, $y_0=y_1>y_2=y_3$. That is, bits $(y_0, y_1, y_2, y_3)$, which are included in a QAM modulation signal, unlike those of a QPSK modulation signal, have different reliabilities.

In 16-QAM modulation, among 4 bits constituting a signal, 2 bits determine signs of the real part and imaginary part of the signal and the remaining 2 bits only need to determine magnitudes of the real part and imaginary part of the signal. Thus, orders of $(y_0, y_1, y_2, y_3)$ and a role of each bit are subject to change.

FIG. 5C schematically illustrates a signal constellation for a conventional 64-QAM modulation.

From among $(y_0, y_1, y_2, y_3, y_4, y_5)$, which correspond to bits of one modulation signal, bits $y_0, y_2$, and $y_4$ determine a magnitude and a sign of the real part, and $y_1, y_3$, and $y_5$ determine a magnitude and a sign of the imaginary part. Here, $y_0$ and $y_1$ determine signs of the real part and the imaginary part, respectively, and a combination of $y_2$ and $y_4$ and a combination of $y_3$ and $y_5$ determine magnitudes of the real part and the imaginary part, respectively. As described above, because distinguishing signs of a modulated signal is easier than distinguishing magnitudes of the modulated signal, reliabilities of $y_0$ and $y_1$ are higher than reliabilities of $y_2, y_3, y_4$, and $y_5$.

The bits $y_2$ and $y_3$ are determined depending on whether a magnitude of the modulated symbol is greater or less than 4, and the bits $y_4$ and $y_5$ are determined according to whether the magnitude of the modulated symbol is closer to 4 or 0, with 2 centered therebetween, or closer to 4 or 8 with 6 centered. Accordingly, a range in which the magnitude is determined by $y_2$ and $y_3$ is 4, while a range for $y_4$ and $y_5$ is 2. Therefore, $y_2$ and $y_3$ is higher than $y_4$ and $y_5$ in reliability. As a result, $y_0=y_1>y_2=y_3>y_4=y_5$ in terms of non-error occurrence probabilities (i.e., reliabilities) of the bits.

In 64-QAM modulation, of 6 bits constituting a signal, 2 bits determine signs of the real part and imaginary part of the signal and 4 bits only need to determine magnitudes of the real part and imaginary part of the signal. Accordingly, orders of $(y_0, y_1, y_2, y_3, y_4, y_5)$ and a role of each bit are subject to change. Even in a signal constellation of 256-QAM or higher, the roles and reliabilities of bits constituting a modulation signal are different as described above. Accordingly, a detailed description thereof is to be omitted herein.

To summarize, in BPSK or QPSK modulation, it is not necessary to consider a modulation scheme when determining shortening and puncturing patterns because as reliabilities of bits included in a symbol are equal, reliabilities of codeword bits are also equal in an LDPC codeword that has undergone shortening or puncturing. However, in high-order modulation such as 16-QAM, 64-QAM, and 256-QAM, because the roles and reliabilities of bits included in a symbol are different, when a modulation scheme and a signal constellation/bit mapping (bit mapping on the signal constellation) scheme have been determined, reliability of each codeword bit in an LDPC codeword, after it undergoes shortening or puncturing, may be different from that of the LDPC codeword before it undergoes shortening or puncturing.

Therefore, there is a demand for an apparatus and method for generating an LDPC code using shortening or puncturing in consideration of high-order modulation.

SUMMARY OF THE INVENTION

The present invention has been designed to address at least the problems and/or disadvantages above and to provide at least the advantages described below. Accordingly, an aspect of an embodiment of the present invention is to provide a channel encoding/decoding method and apparatus for generating, from a given LDPC code, an LDPC code with a different codeword length using shortening or puncturing determined in consideration of high-order modulation, and encoding and decoding a channel using the generated LDPC code in a communication system.

Another aspect of an embodiment of the present invention is to provide a channel encoding/decoding method and apparatus for providing optimal performance considering a DVB-S2 structure in a communication system using LDPC codes.

In accordance with an aspect of an embodiment of the present invention, a method is provided for encoding a channel in a communication system using a Low-Density Parity-Check (LDPC) code, in which a transmission modulation scheme for a symbol is determined, columns corresponding to an information word in a parity-check matrix of the LDPC code are grouped into a plurality of column groups, the column groups are ordered, a range of an information word desired to be obtained by shortening is determined, column group-by-column group shortening is performed on the column groups in an order according to a shortening pattern determined in consideration of the determined modulation scheme based on the range of the information word, and the shortened information word is LDPC-encoded.

In accordance with another aspect of an embodiment of the present invention, an apparatus is provided for encoding a channel in a communication system using a Low-Density Parity-Check (LDPC) code. The apparatus includes a parity-check matrix extractor for determining a transmission modulation scheme for a symbol, grouping columns corresponding to an information word in a parity-check matrix of the LDPC code into a plurality of column groups, and ordering the column groups, a shortening pattern applier for determining a range of an information word desired to be obtained by shortening, and based on the range of the information word, performing column group-by-column group shortening on the column groups in an order according to a shortening pattern determined in consideration of the determined modulation scheme, and an LDPC encoder for LDPC-encoding the shortened information word.

In accordance with another aspect of an embodiment of the present invention, a method is provided for decoding a channel in a communication system using a Low-Density Parity-Check (LDPC) code, in which a signal transmitted from a transmitter is demodulated, it is determined whether there is at least one shortened bit in the demodulated signal, a position of the shortened information bit is determined by estimating information about a shortening pattern when there is at least one shortened bit, and data is decoded using the determined position of the shortened information bit. The information about the shortening pattern includes a shortening pattern determined in consideration of a modulation scheme.

In accordance with another aspect of an embodiment of the present invention, there is provided an apparatus for decoding a channel in a communication system using a Low-Density Parity-Check (LDPC) code. the apparatus includes a shortening pattern estimator for demodulating a signal transmitted from a transmitter, determining whether there is at least one shortened bit in the demodulated signal, and when there is at least one shortened bit, determining a position of the shortened information bit by estimating information about a shortening pattern, and a decoder for decoding data using the determined position of the shortened information bit. The information about the shortening pattern includes a shortening pattern determined by consideration of a modulation scheme.

BRIEF DESCRIPTION OF THE DRAWINGS

The above and other aspects, features, and advantages of certain embodiments of the present invention will be more apparent from the following description taken in conjunction with the accompanying drawings, in which:

Figure 4:
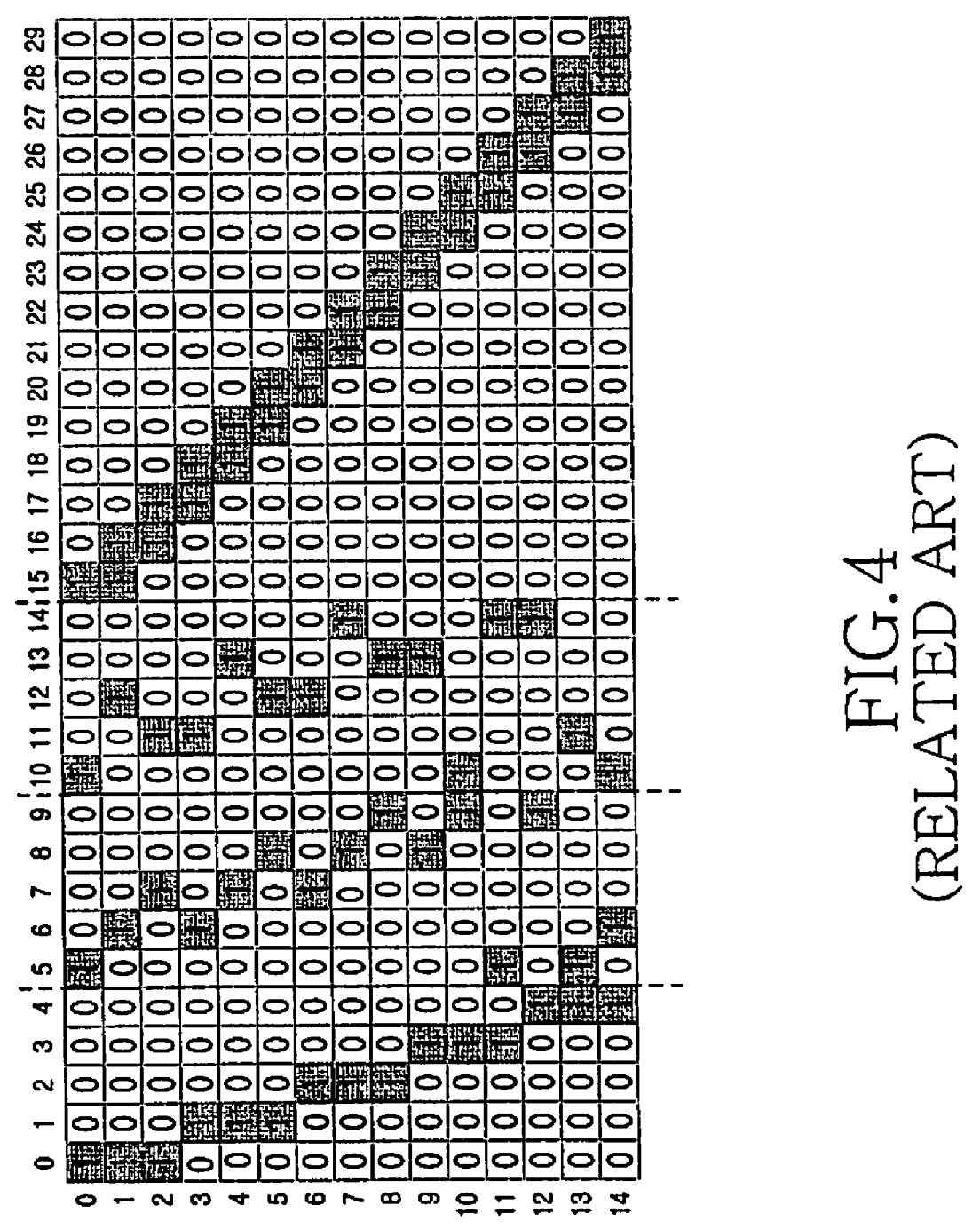

FIG. 4 illustrates an example of a parity-check matrix of a DVB-S2 LDPC code;

Throughout the drawings, the same drawing reference numerals will be understood to refer to the same elements, features and structures.

DETAILED DESCRIPTION OF EMBODIMENTS OF THE INVENTION

The following description with reference to the accompanying drawings is provided to assist in a comprehensive understanding of the embodiments of the invention as defined by the claims and their equivalents. It includes various specific details to assist in that understanding, but these should not be construed as limitations. Accordingly, those of ordinary skill in the art will recognize that various changes and modifications of the embodiments described herein can be made without departing from the scope and spirit of the present invention. In addition, descriptions of well-known functions and constructions are omitted for clarity and conciseness.

Further, the terms and words used in the following description and claims are not limited to the bibliographical meanings, but, are used by the inventor to enable a clear and consistent understanding of the present invention. Accordingly, it should be apparent to those skilled in the art that the following description of the embodiments of the present invention are provided for illustration purpose only and not for the purpose of limiting the invention as defined by the appended claims and their equivalents.

The following description of the embodiments of the present invention provides a method for supporting an LDPC code with various codeword lengths suitable for high-order modulation, using a parity-check matrix of a structured LDPC code with a particular form. In addition, the description of the embodiments of the present invention provides an apparatus for supporting various codeword lengths according to high-order modulation in a communication system using an LDPC code in a particular form, and a method for controlling the same. In particular, the description of the embodiments of the present invention provides a method for generating an LDPC code using a parity-check matrix of a given LDPC code, the generated LDPC code being smaller than the given LDPC code, and an apparatus thereof.

Figure 6:
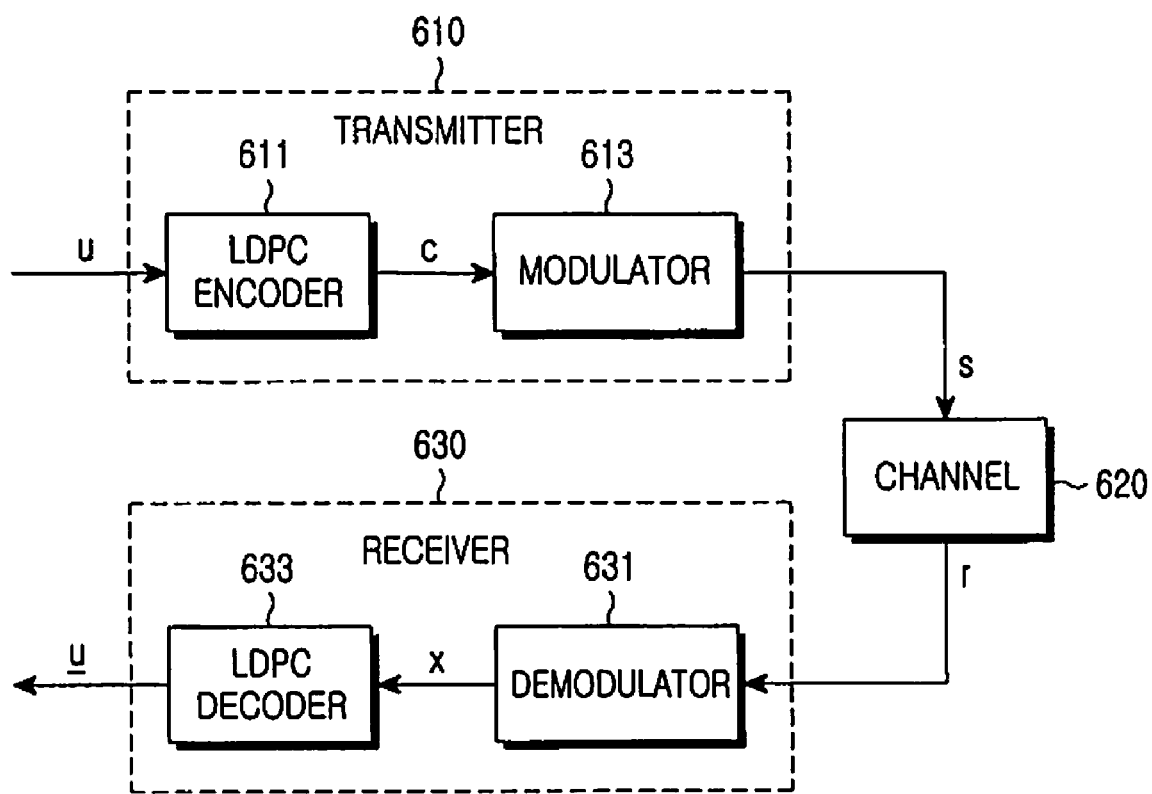
FIG. 6 is a block diagram of a transceiver in a communication system using an LDPC code.

FIG. 6 is a block diagram of a transceiver in a communication system using an LDPC code.

Referring to FIG. 6, a message u is input to an LDPC encoder 611 in a transmitter 610 before being transmitted to a receiver 630. The LDPC encoder 611 encodes the input message u, and outputs the encoded signal c to a modulator 613. The modulator 613 modulates the encoded signal c, and transmits the modulated signal s to the receiver 630 over a wireless channel 620. A demodulator 631 in the receiver 630 demodulates the received signal r, and outputs the demodulated signal x to an LDPC decoder 633. The LDPC decoder 633 decodes the demodulated signal x, resulting in an estimate u of the message based on the data received through the wireless channel 620.

The LDPC encoder 611 generates a parity-check matrix according to a codeword length required by a communication system, using a preset scheme. Particularly, in accordance with an embodiment of the present invention, an LDPC encoder will support various codeword lengths using the LDPC code without the separate need for additional stored information.

In accordance with an embodiment of the present invention, a method of acquiring various codeword lengths from a given LDPC code uses shortening or puncturing. Methods that optimize performance by applying shortening or puncturing to an LDPC code in accordance with a code rate or a codeword length are currently known. However, in most cases, because the known method of determining the shortening and puncturing patterns performs the optimization process considering only Binary Phase Shift Keying (BPSK) or Quadrature Phase Shift Keying (QPSK), only one optimized shortening and/or puncturing pattern can exist for a given LDPC code.

However, the puncturing and shortening patterns optimized when a signal constellation/bit mapping scheme has been determined in high-order modulation can be different from those for BPSK or QPSK modulation.

In BPSK or QPSK modulation, because reliabilities of bits included in a symbol are equal, reliabilities of codeword bits in an LDPC codeword after it undergoes shortening or puncturing are also equal. Consequently, there is no need to consider a modulation scheme in the process of determining the shortening and puncturing patterns. However, as described above, in high-order modulation such as 16-QAM, 64-QAM, and 256-QAM, because reliabilities of bits included in a symbol are different, when a modulation scheme and a signal constellation/bit mapping scheme have been determined, reliability of each codeword bit in an LDPC codeword after it undergoes shortening or puncturing may be different from that of the LDPC codeword before it undergoes shortening or puncturing.

Figure 7A:
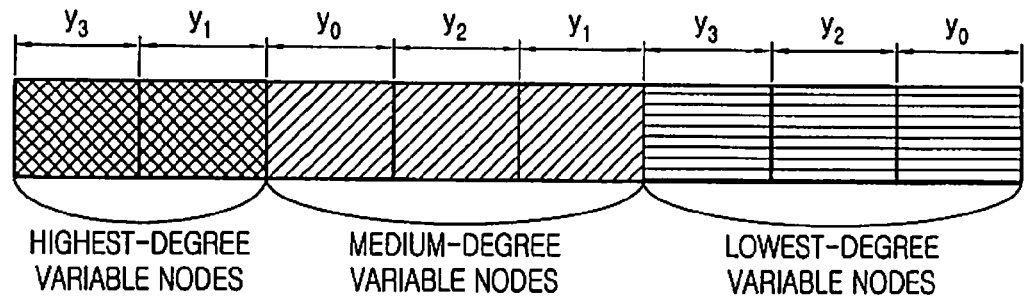
FIG. 7A illustrates an example of signal constellation/bit mapping in 16-QAM modulation.
Figure 7B:
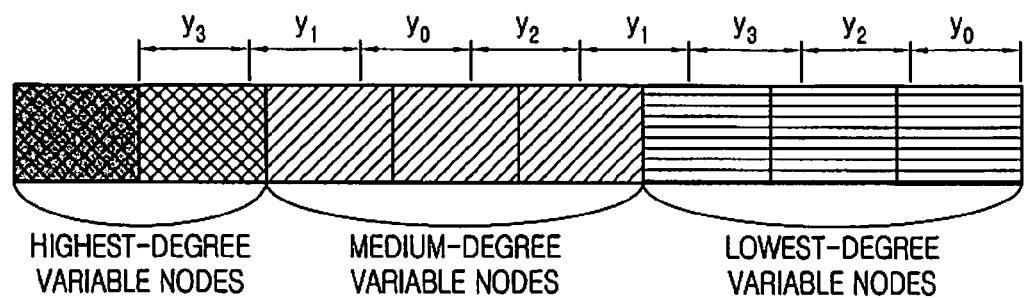
FIG. 7B illustrates an example of signal constellation/bit mapping modified by shortening in 16-QAM modulation.

FIGS. 7A and 7B and FIGS. 8A and 8B illustrate bit mapping examples in which bits are mapped to a symbol according to degrees of variable nodes in an LDPC codeword, for 16-QAM and 64-QAM, respectively. More specifically, FIG. 7A illustrates an example of signal constellation/bit mapping in 16-QAM modulation, and FIG. 7B illustrates an example of signal constellation/bit mapping modified by shortening in 16-QAM modulation. For convenience, an LDPC codeword is divided herein into an 8 or 12-bit partial block.

Referring to FIG. 7A, $y_0$ and $y_1$ indicate high-reliability bits that determine signs of a real part and an imaginary part in a 16-QAM symbol, respectively. That is, reliability relationship between the bits are $y_0=y_1>y_2=y_3$. In FIG. 7A, because $y_1$ and $y_3$ are mapped to an LDPC codeword bit part corresponding to the highest-degree variable nodes, ½ of the highest-degree variable nodes are mapped to a high-reliability part while the other ½ are connected to a low-reliability part.

Assuming that the half of the highest-degree variable nodes have undergone shortening as illustrated in FIG. 7B, when symbol bits corresponding to the non-shortened highest-degree variable node are considered in the shortened LDPC codeword, ⅞ of a highest-degree variable node is mapped to $y_3$ and the other ⅛ is mapped to $y_1$. That is, the bit ratio is very different from that before the shortening.

Figure 8A:
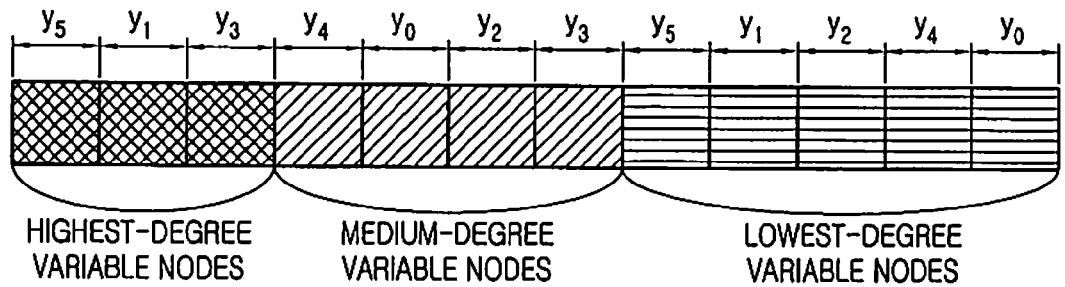
FIG. 8A illustrates an example of signal constellation/bit mapping in 64-QAM modulation.
Figure 8B:
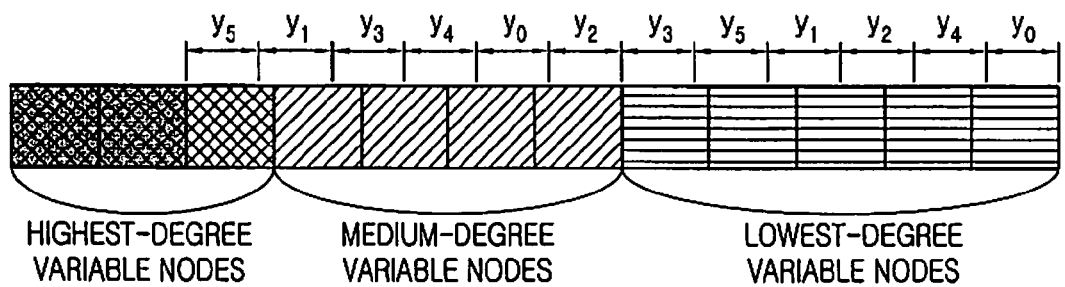
FIG. 8B illustrates an example of signal constellation/bit mapping modified by shortening in 64-QAM modulation.

Similarly, FIG. 8A illustrates an example of signal constellation/bit mapping in 64-QAM modulation, and FIG. 8B illustrates an example of signal constellation/bit mapping modified by shortening in 64-QAM modulation.

In FIG. 8A, a reliability relationship between bits included in a symbol is $y_0=y_1>y_2=y_3>y_4=y_5$. In this case, it can be appreciated that ⅓ of variable nodes with the highest degree in the LDPC codeword are mapped to the lowest-reliability bit $y_5$. However, when ⅔ of the highest-degree variable nodes undergo shortening as illustrated in FIG. 8B, it can be understood that ⅚ of the remaining non-shortened highest-degree variable node is mapped to the lowest-reliability bit $y_5$, so that the bit ratio is different from that before the shortening.

When the high-order modulation scheme and the signal constellation/bit mapping scheme are fixed for a given LDPC code as described above, the shortening or puncturing pattern used in BPSK or QPSK modulation may not be suitable because a ratio of the LDPC codeword bit being mapped to each bit of a modulation symbol is very different according to the shortening technique.

It is also known that in the case of an LDPC code, degree distribution of a parity-check matrix of its optimized LDPC code is very different according to the modulation scheme. That is, degree distribution of an LDPC code optimized for BPSK or QPSK modulation and degree distributions of LDPC codes optimized for 16-QAM, 64-QAM, and 256-QAM are all different.

For similar reasons, it is obvious that when it is assumed that an LDPC code having one degree distribution is given, the optimized shortening or puncturing pattern is different according to the high-order modulation scheme. Accordingly, a shortening pattern should be determined considering an intended modulation scheme in order to find an optimized shortening or puncturing pattern of an LDPC code.

Shortening will be described below before a description of a method for determining a shortening or puncturing pattern in consideration of a modulation scheme is given. The term "shortening" as used herein refers to a method that does not substantially transmit a specified part of an LDPC codeword, after generating the LDPC codeword from a given particular parity-check matrix by performing LDPC encoding. For a better understanding of shortening, a parity-check matrix of the DVB-S2 LDPC code illustrated in FIG. 3 will be described in more detail below.

Figures 1, 2:
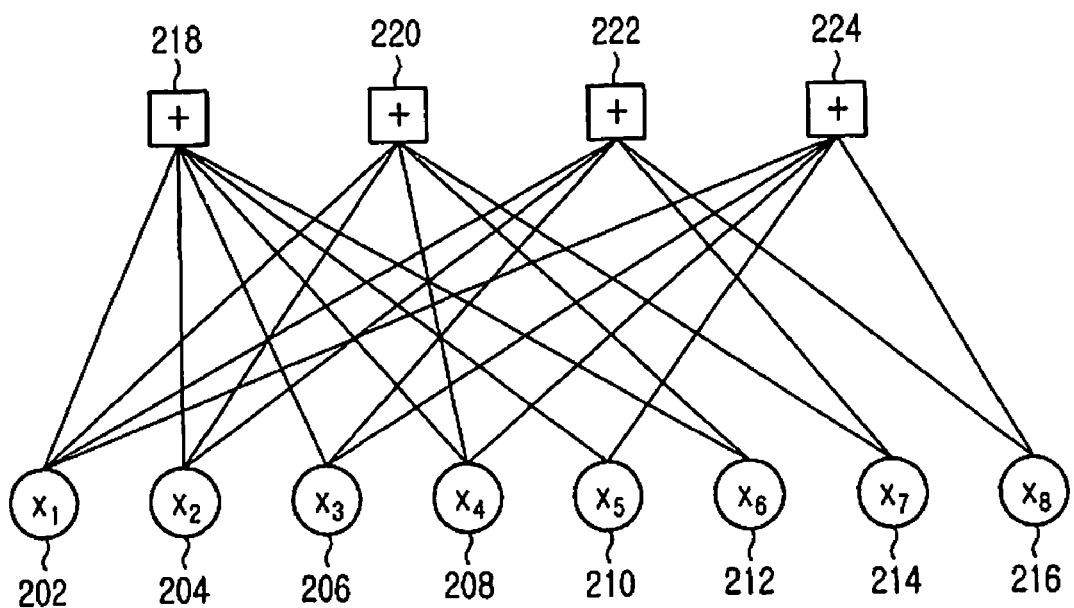
FIG. 1 illustrates an example of a parity-check matrix of a length-8 LDPC code.
FIG. 2 illustrates a Tanner graph for a parity-check matrix of a length-8 LDPC code.
Figure 3:
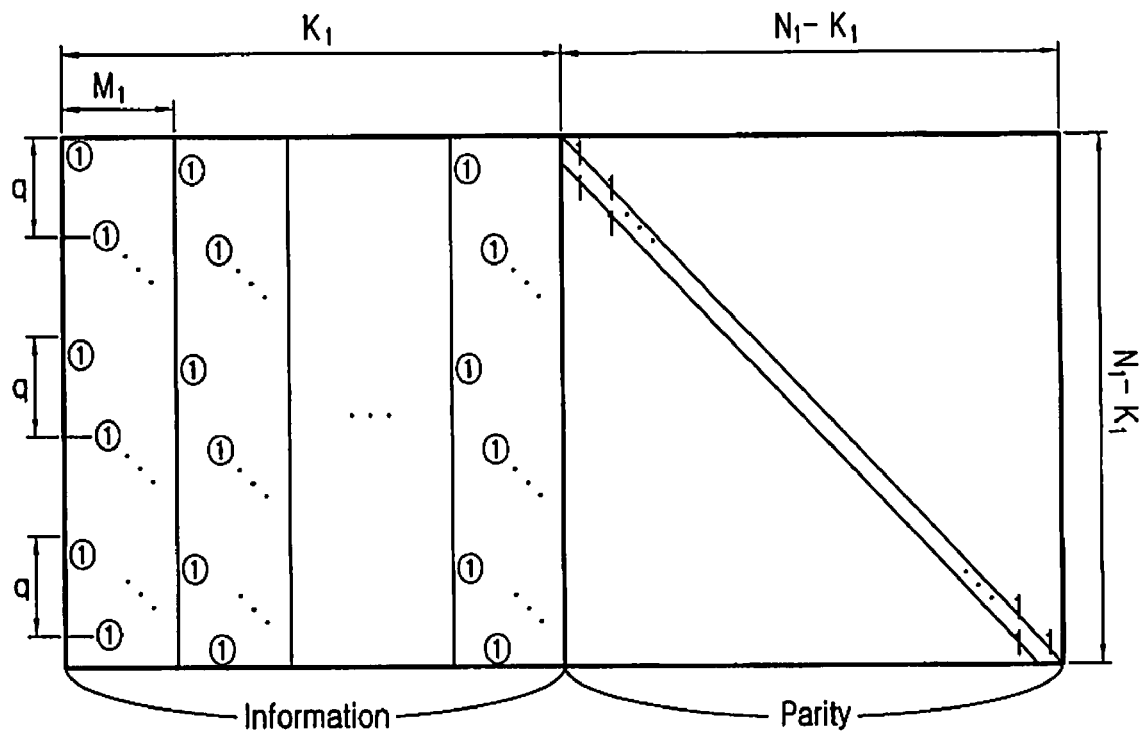
FIG. 3 illustrates a schematic structure of a DVB-S2 LDPC code.
Figure 5A:
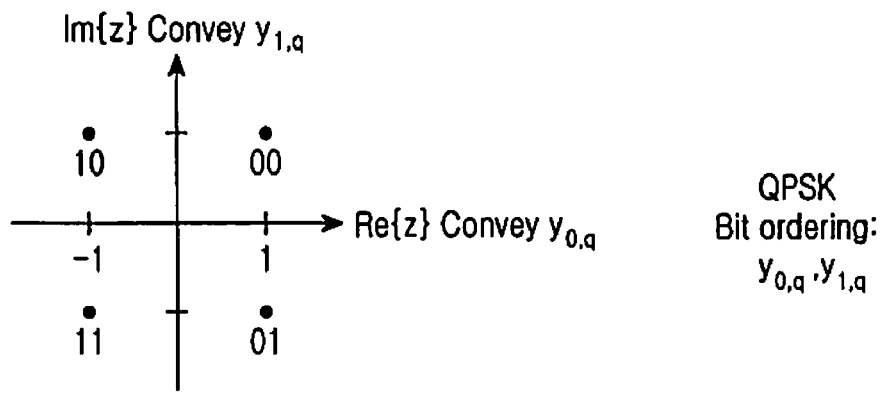
FIG. 5A schematically illustrates a signal constellation for a conventional QPSK modulation used in a digital communication system.
Figure 5B:
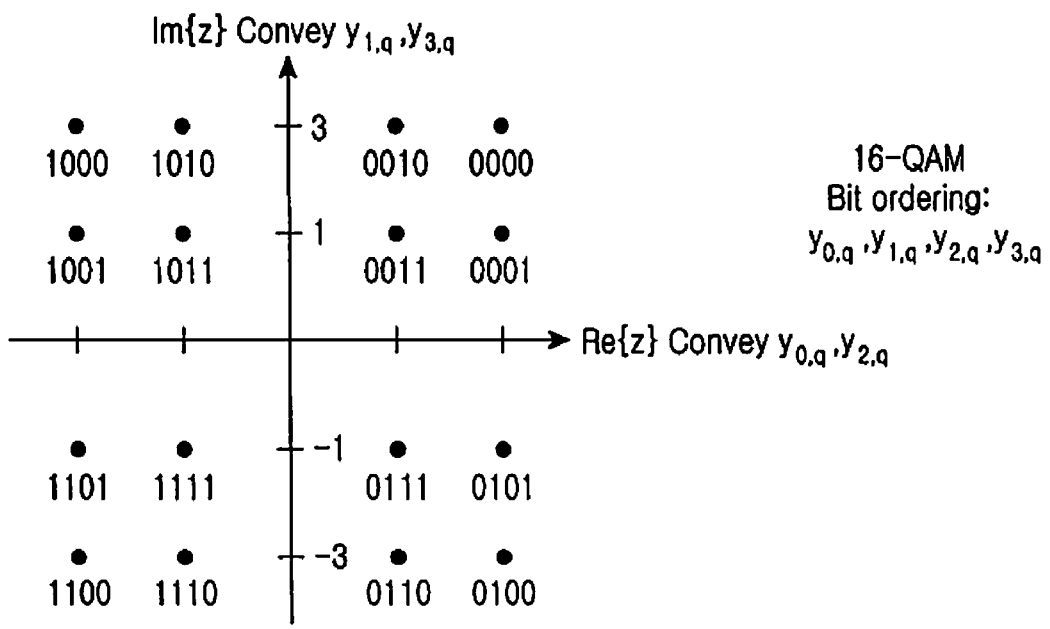
FIG. 5B schematically illustrating a signal constellation for a conventional 16-QAM modulation used in a digital communication system.
Figure 5C:
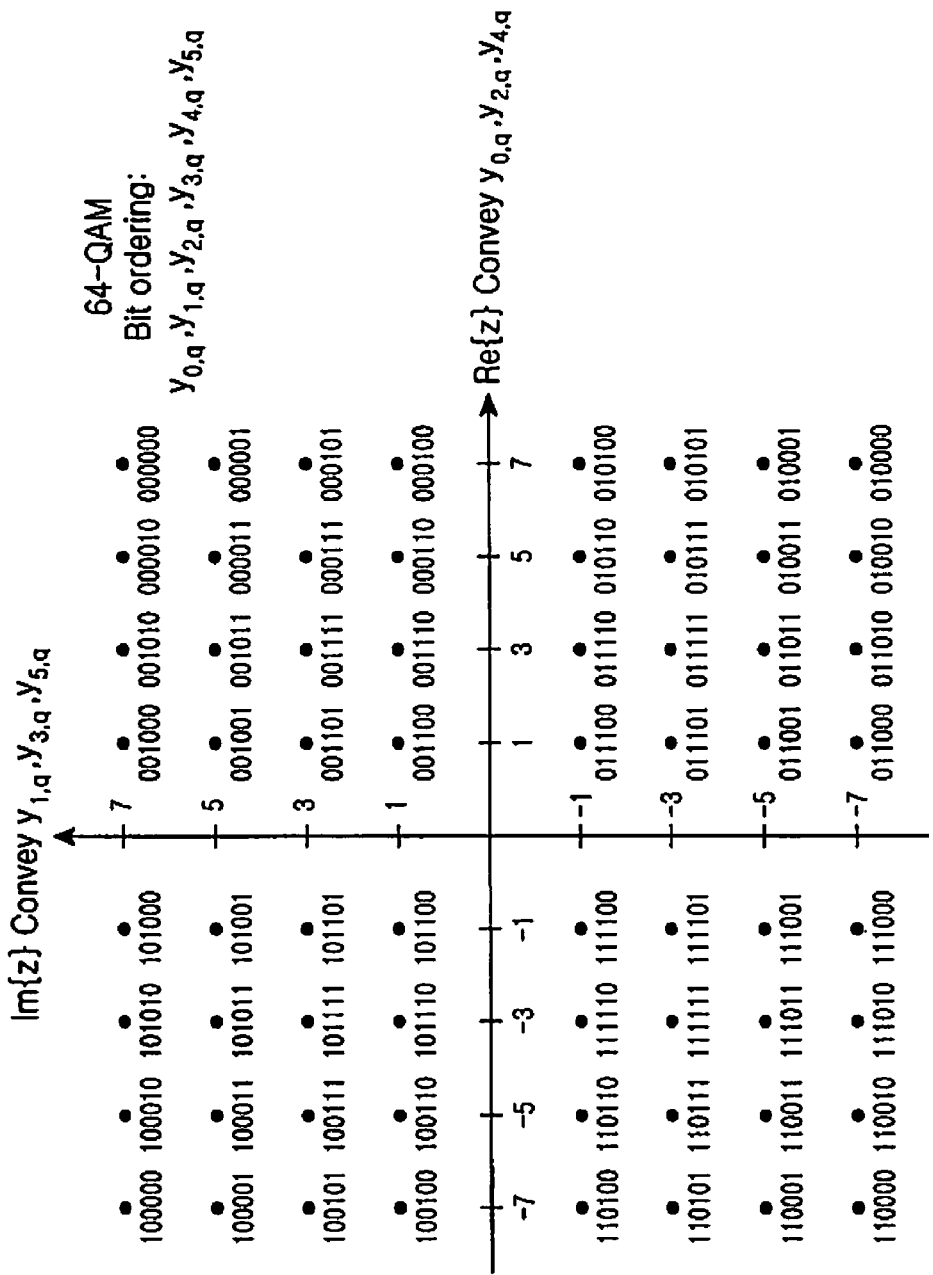
FIG. 5C schematically illustrates a signal constellation for a conventional 64-QAM modulation used in a digital communication system.

For the parity-check matrix of the DVB-S2 LDPC code illustrated in FIG. 3, the total length is $N_1$, length-$K_1$ information bits ($i_0, i_1, \ldots, i_{K_1-1}$) corresponds to a front part of the parity-check matrix, and length-$(N_1-K_1)$ parity bits ($p_0, p_1, \ldots, p_{N_1-K_1-1}$) corresponds to a rear part of the parity-check matrix. Commonly, information bits freely have a value of 0 or 1, and the shortening technique restricts values of information bits in a particular part that is subject to shortening. For example, shortening $N_s$ information bits $i_0$ to $i_{N_s-1}$ commonly means that $i_0=i_1=i_{N_s-1}=0$. That is, by limiting values for $N_s$ information bits $i_0$ through $i_{N_s-1}$, to 0, the shortening technique can obtain the same effect as substantially not using $N_s$ leading columns in the parity-check matrix of the DVB-S2 LDPC code illustrated in FIG. 3. The term "shortening" actually originates from the above-described limitation operation. Therefore, applying shortening herein also means considering values of the shortened information bits, as 0.

With respect to the shortening technique, when the system is set up, a transmitter and a receiver can share or generate the same position information for the shortened information bits. Therefore, though the transmitter has not transmitted the shortened bits, the receiver can perform decoding, already knowing that information bits in the positions corresponding to the shortened bits have a value of 0.

In the shortening technique, because a length of a codeword that the transmitter actually transmits is $N_1-N_s$ and a length of an information word is $K_1-N_s$, the code rate becomes $(K_1-N_s)/(N_1-N_s)$, which is always less than the first given code rate $K_1/N_1$.

Generally, a puncturing technique can be applied to both the information bits and the parity bits. Although the puncturing technique and the shortening technique commonly reduce codeword lengths, the puncturing technique, unlike the shortening technique described above, does not limit values of particular bits.

More specifically, the puncturing technique is simply a method for not transmitting particular information bits or a particular part of generated parity bits, such that a receiver can erase the corresponding bits. That is, by simply not transmitting bits in $N_p$ predefined positions in a generated length-$N_1$ LDPC codeword, the puncturing technique obtains the same effect as that obtained by transmitting a length-$(N_1-N_p)$ LDPC codeword. Because columns corresponding to the punctured bits in the parity-check matrix are all used intact in a decoding process, the puncturing technique is distinct from the shortening technique.

Further, in accordance with an embodiment of the present invention, because position information for the punctured bits can be shared or estimated in common by the transmitter and the receiver when the system is set up, the receiver may merely erase the corresponding punctured bits, before decoding.

In the puncturing technique, because a length of a codeword that the transmitter actually transmits is $N_1-N_p$ and a length of an information word is constantly $K_1$, the code rate becomes $K_1/(N_1-N_p)$, which is always greater than the first given code rate $K_1/N_1$.

A description will now be made of a shortening technique and a puncturing technique suitable for the DVB-S2 LDPC code. The DVB-S2 LDPC code, as described above, is an LDPC code having a particular structure. Therefore, compared with the normal LDPC code, the DVB-S2 LDPC code is able to undergo more efficient shortening and puncturing.

For convenience of this example, it is assumed that the DVB-S2 LDPC code has a codeword length and an information length are $N_1$ and $K_1$, respectively, and a codeword length and an information length of an LDPC code that are desired to be finally obtained from the DVB-S2 LDPC code using the shortening technique and the puncturing technique are $N_2$ and $K_2$, respectively.

If a definition of $N_1-N_2=N_\Delta$ and $K_1-K_2=K_\Delta$ is given, it is possible to generate the LDPC code whose codeword length and information length are $N_2$ and $K_2$, respectively, by shortening $K_\Delta$ bits and puncturing $(N_\Delta-K_\Delta)$ bits from the parity-check matrix of the DVB-S2 LDPC code. For the generated LDPC code with $N_\Delta>0$ or $K_\Delta>0$, because its code rate $$\frac{K_1 - K_\Delta}{N_1 - N_\Delta}$$

is generally different from the code rate $K_1/N_1$ of the DVB-S2 LDPC code, its algebraic characteristic changes. For $N_\Delta=K_\Delta$, the LDPC code is generated by not performing shortening and puncturing or by performing only shortening.

However, regarding the DVB-S2 LDPC code, as described in Rules 1 and 2, as one $R_{i,j}^{(k)}$ (k=1,2,\ldots,D_i, i=1,\ldots,K_1/M_1, j=0,\ldots,M_1-1) value corresponds to $M_1$ columns, a total of $K_1/N_1$ column groups each have a structural shape. Therefore, the DVB-S2 LDPC code is equal to an LDPC code that does not use $M_1$ columns, if it does not use one $R_{i,j}^{(k)}$ value. The following shortening process, which will be described with reference to FIG. 9, is proposed considering such characteristics.

Figure 9:
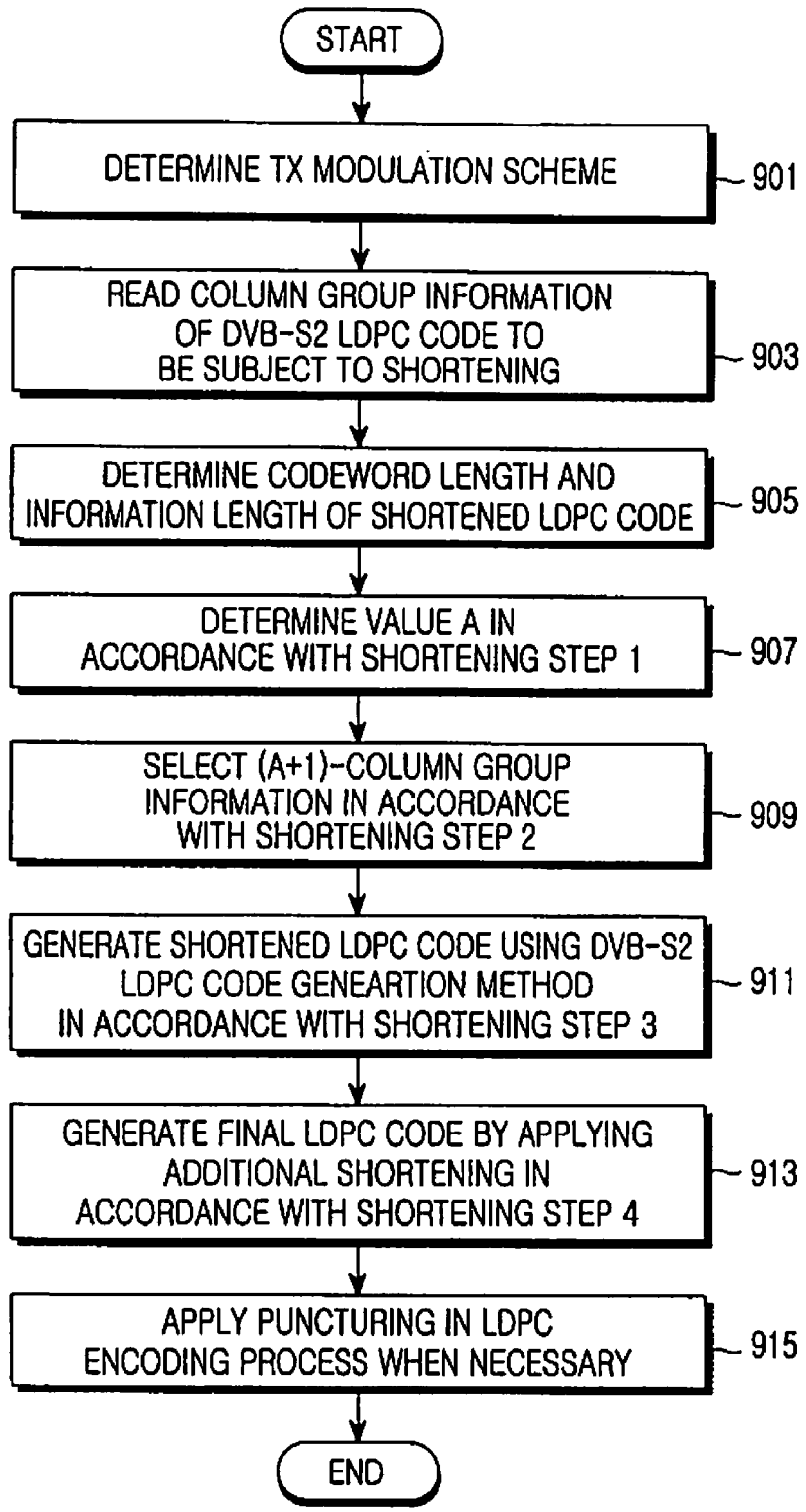
FIG. 9 illustrates a procedure for generating an LDPC code with a different codeword length from a parity-check matrix of a stored LDPC code according to an embodiment of the present invention.

FIG. 9 illustrates a procedure for generating an LDPC code with a different codeword length from a parity-check matrix of a stored LDPC code according to an embodiment of the present invention.

Referring to FIG. 9, an LDPC encoder determines a transmission modulation scheme for a symbol in step 901, and reads column group information of a DVB-S2 LDPC code to be subjected to shortening in step 903. That is, the LDPC encoder reads stored parity-check matrix information. Thereafter, the LDPC encoder determines a codeword length $N_2$ and an information length $K_2$ based on the column group information of the DVB-S2 LDPC code in step 905. Thereafter, the LDPC encoder performs a shortening process of steps 907 to 913, in which the LDPC encoder performs shortening corresponding to a required information length of an LDPC code, based on the read information of the stored parity-check matrix.

Shortening Step 1: The LDPC encoder determines $$A = \left\lfloor \frac{K_2}{M_1} \right\rfloor$$

in step 907, where $\lfloor x \rfloor$ is a maximum integer which is less than or equal to x.

Shortening Step 2: The LDPC encoder selects a sequence for (A+1) column groups from among $R_{i,0}^{(k)}$(i=1, ..., $K_1/M_1$) column groups in step 909. The selected sequence is defined as $S_{i,0}^{(k)}$(i=1, ..., A+1). The LDPC encoder considers that there is no sequence for the remaining $K_1/M_1-A-1$ column groups except for the partial sequence $S_{i,0}^{(k)}$ in the sequence $R_{i,0}^{(k)}$.

Shortening Step 3: The LDPC encoder determines positions of column groups corresponding to an information word of the DVB-S2 LDPC code from the sequence $S_{i,0}^{(k)}$ of (A+1) column groups selected in Shortening Step 2, generating a shortened DVB-S2 LDPC code in step 911. It should be noted that the shortened LDPC code has an information length (A+1)$M_1$, which is always greater than or equal to $K_2$.

Shortening Step 4: The LDPC encoder additionally shortens (A+1)$M_1-K_2$ columns from the shortened LDPC code generated in Shortening Step 3 in step 913.

In Shortening Step 4, the additional shortening is more easily implemented if the process is sequentially performed from the rear or the front of the column group where the additional shortening is achieved.

As described above, an embodiment of the present invention applies an efficient shortening technique that does not use information on column groups of the DVB-S2 LDPC code depending on the structural features of the DVB-S2 LDPC code, compared with a conventional bit-by-bit shortening technique, which is commonly used for shortening of the DVB-S2 LDPC code.

Selection criteria of a sequence for column groups can be summarized as follows in Step 2 in the shortening process of the DVB-S2 LDPC code.

Criterion 1: The LDPC encoder selects a shortening pattern sequence for column groups defined such that optimal degree distribution obtainable by considering a modulation scheme given for a normal LDPC code with a codeword length $N_2$ and an information length $K_2$ is as similar as possible to degree distribution of a shortened LDPC code with a codeword length $N_2$ and an information length $K_2$, obtained by performing shortening on a DVB-S2 LDPC code with a codeword length $N_1$ and an information length $K_1$.

Criterion 2: The LDPC encoder selects a shortening pattern sequence for column groups defined to provide a code having the good cycle characteristic on the Tanner graph among the shortened codes selected in Criterion 1. In accordance with an embodiment of the present invention, regarding a criterion for a cycle characteristic, the LDPC encoder selects a sequence where the minimum-length cycle in the Tanner graph is as large as possible and the number of the minimum-length cycles is as small possible.

The optimal degree distribution of the normal LDPC code in which the modulation scheme is considered, can be found out in Criterion 1 using a density evolution analysis method, various implementations of which are known in the art. However, because the process of determining the degree distribution using the density evolution method is not essential to the understanding of the present invention, a detailed description thereof will not be provided.

If the number of all possible (shortening pattern) sequences for the column groups is not great, the LDPC encoder may select (shortening pattern) sequence for the column group having the best performance by fully searching all the sequences regardless of Criterions 1 and 2. However, the selection criteria for column groups, applied in Shortening Step 2 for the DVB-S2 LDPC code enable to efficiently select a (shortening pattern) by selecting an LDPC code satisfying the both conditions when the number of all possible (shortening pattern) sequences for the column group is too large.

Criterion 1 and Criterion 2 are applied when $N_2$ and $K_2$ are fixed values. However, if values of $N_2$ and $K_2$ required in the system are varying, the shortening patterns optimized according to the value of $K_2$ may have no correlation. That is, when the values of $N_2$ and $K_2$ required in the system are varying, all of shortening patterns optimized according to the value of $K_2$ should be stored separately, for optimized performance.

Therefore, for system efficiency, suboptimal shortening patterns can be found, as will be described below, when the values of $N_2$ and $K_2$ required in the system are varying.

Finding A Suboptimal Shortening Pattern Sequence

Assuming that selection of one column group is needed for shortening, because the number of selectable column groups is only one, it is possible to select a column group having the best performance. When selection of two column groups is needed for shortening, one column group showing the best performance, together with the already selected column group, are selected from the remaining column groups. Similarly, when selection of i column groups is needed for shortening, one column group having the best performance, together with (i−1) column groups selected in the previous step for shortening, are selected from the remaining column groups.

Though the above method cannot guarantee optimal selection for all cases, it has relatively stable performance from the shortening pattern having one regular rule, regardless of the change in the value of $K_2$. Therefore, the above-described the method has advantages of relatively stable performance and easy storage of shortening patterns.

A DVB-S2 LDPC code having a total of G column groups corresponding to information bits will be described below by way of example. Assuming that orders of column groups, which are subjected to shortening in accordance with the method of determining shortening patterns are set as $B_1, B_2, B_3, \ldots, B_X$, when only the sequence meaning the orders of the column groups is stored, efficient shortening is possible for an arbitrary $K_2$ through Shortening Step 1 to Shortening Step 4.

In order to show an example of the difference between shortening patterns found according to respective modulation schemes using the above methods, Table 1A and Table 1B below show shortening methods and shortening patterns suboptimized for BPSK/QPSK, 16-QAM, and 64-QAM modulations with regard to a DVB-S2 LDPC code with a codeword length $N_1=16200$ and an information length $K_1=7200$.

TABLE 1A

| Major variables of DVB-S2 LDPC code | $N_1 = 16200, K_1 = 7200, M_1 = 360, q = 25$ |
|---|---|
| Range of $K_2$ | Shortening Method |
| 1) $528 \leq K_2 < 7200$ | For an integer $m = \left\lfloor \dfrac{7200 - K_2}{360} \right\rfloor$, shorten all of m column groups corresponding to $\pi(0)^{th}, \pi(1)^{th}, \ldots, \pi(m-1)^{th}$ rows, and additionally shorten $7200-K_2-360m$ information bits from a column group corresponding to a $\pi(m)^{th}$ row.<br>Here, $\pi$ indicates a permutation function that means a shortening pattern, and the relationships are shown at the bottom of the table.<br>However, when a part of a column group corresponding to a $\pi(18) = 19^{th}$ row is shortened, columns in the positions corresponding to 168 Bose-Chaudhuri-Hocquenghem (BCH) parity bits do not undergo shortening. |

TABLE 1A-continued

| Major variables of DVB-S2 LDPC code | $N_1 = 16200, K_1 = 7200, M_1 = 360, q = 25$ |
|---|---|
| Range of $K_2$ | Shortening Method |
| 2) $168 \leq K_2 < 528$ | Shorten all column groups corresponding to $\pi(0)^{th}$, $\pi(1)^{th}, \ldots, \pi(17)^{th}$ rows, and shorten all columns except for columns in the positions corresponding to 168 BCH parity bits from a column group corresponding to a $\pi(18) = 19^{th}$ row. Also, additionally shorten $528-K_2$ information bits from a column group corresponding to a $\pi(19) = 0^{th}$ row. |

TABLE 1B

Relationship between permutation functions suboptimized on BPSK/QPSK

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 3 | 2 | 7 | 6 | 5 | 1 | 19 | 0 |

Relationship between permutation functions suboptimized on 16QAM

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(0)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 3 | 9 | 2 | 8 | 7 | 6 | 1 | 5 | 19 | 0 |

Relationship between permutation functions suboptimized on 64QAM

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 4 | 3 | 18 | 17 | 2 | 16 | 15 | 14 | 13 | 12 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 11 | 10 | 9 | 1 | 8 | 7 | 6 | 5 | 19 | 0 |

Referring to Table 1A and Table 1B, it can be appreciated that when a length of information bits to be shortened is determined, the shortening method is performed through a predetermined process regardless of the modulation scheme, but the relationships between permutation functions indicating optimized shortening patterns are all different according to modulation schemes. That is, when the shortening method is applied without considering the modulation scheme, significant performance degradation may occur according to modulation schemes.

The suboptimized shortening patterns shown in Table 1B, found for the shortening method in Table 1A, may not be unique according to conditions for finding the shortening patterns. For example, several column groups may exist that show similar performance in the interim process described above, i.e., Finding A Suboptimal Shortening Pattern Sequence. In this case, because selection of the next column groups may differ according to selection of column groups, the suboptimized shortening patterns may not be unique according to performance difference of the shortening process. Actually, shortening patterns shown in Table 1C also provide excellent performance, similar to the shortening method performance shown in Table 1A.

TABLE 1C

Relationship between permutation functions suboptimized on BPSK/QPSK (2)

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 3 | 2 | 7 | 6 | 5 | 1 | 19 | 0 |

Relationship between permutation functions suboptimized on 16QAM (2)

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(0)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 7 | 3 | 2 | 1 | 6 | 5 | 19 | 0 |

Relationship between permutation functions suboptimized on 64QAM (2)

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 4 | 15 | 14 | 13 | 12 | 3 | 11 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 10 | 9 | 2 | 8 | 7 | 1 | 6 | 5 | 19 | 0 |

The bit mapping methods corresponding to the signal constellations used in 16-QAM and 64-QAM modulations of Table 1C are the results obtained by applying the same bit mapping methods as those illustrated in FIGS. 7A, 7B, 8A, and 8B.

Referring back to FIG. 9, after step 913, when puncturing is needed, the LDPC encoder applies puncturing in the LDPC encoding process in step 915. The puncturing method will now be described below.

Assuming that a codeword length and an information length of an LDPC code are $N_2$ and $K_2$, respectively, that the invention desires to finally obtain from the DVB-S2 LDPC code whose codeword length and information length are $N_1$ and $K_1$, respectively, using the shortening technique and the puncturing technique, and that a definition of $N_1-N_2=N_A$ and $K_1-K_2=K_A$ is given, it is possible to generate the LDPC code having a codeword length and information length of $N_2$ and $K_2$, respectively, by shortening $K_A$ bits and puncturing $(N_A-K_A)$ bits from the parity-check matrix of the DVB-S2 LDPC code. For convenience, when it is assumed that the puncturing technique is applied only to the parity part, there is a possible method for puncturing 1 bit from the parity part every $(N_1-K_1)/(N_A-K_A)$ bits because the parity length is $N_1-K_1$. However, various other puncturing methods are also available.

Figure 10:
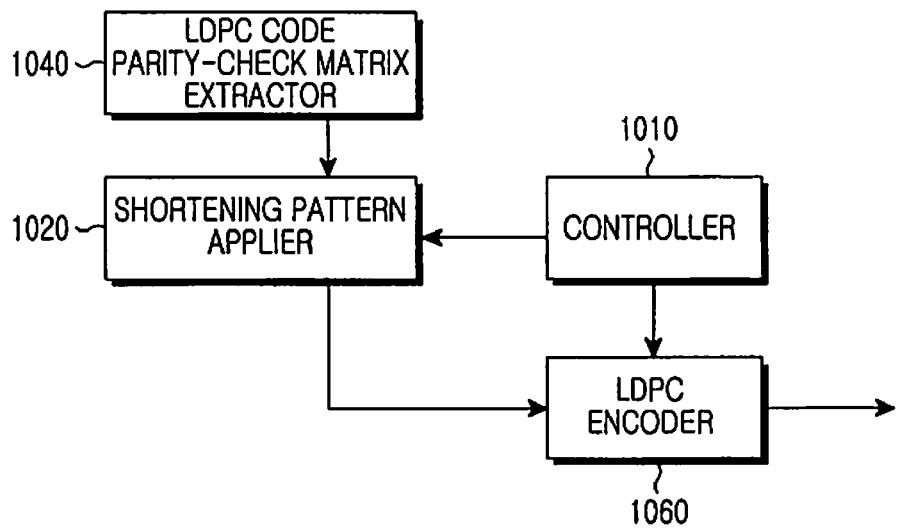
FIG. 10 illustrates a block diagram of a transmission apparatus using a proposed shortened LDPC code according to an embodiment of the present invention.

FIG. 10 illustrates a block diagram of a transmission apparatus using a shortened LDPC code according to an embodiment of the present invention.

Referring to FIG. 10, a transmission apparatus includes a controller 1010, a shortening pattern applier 1020, an LDPC code parity-check matrix extractor 1040, and an LDPC encoder 1060. The LDPC code parity-check matrix extractor 1040 extracts an LDPC code parity-check matrix that has undergone shortening. The LDPC code parity-check matrix can be extracted using a memory, can be given in the transmission apparatus, or can be generated in the transmission apparatus. In addition, the LDPC code parity-check matrix extractor 1040 determines a transmission modulation scheme for a transmission symbol, groups columns corresponding to an information word in the parity-check matrix of the LDPC code into a plurality of column groups, and orders the column groups.

The shortening pattern applier 1020 determines a range of an information word it desires to obtain through shortening, and based on the range of the information word, performs column group-by-column group shortening on the column groups in an order according to a shortening pattern determined in consideration of the determined modulation scheme.

The controller 1010 controls the shortening pattern applier 1020 to determine a shortening pattern according to the transmission modulation scheme and the information length, and the shortening pattern applier 1020 inserts bits having a value of 0 in positions corresponding to the shortened bits, or removes columns corresponding to the shortened bits from a parity-check matrix of a given LDPC code. The shortening pattern can be a shortening pattern stored in a memory, generated using a sequence generator (not shown), or acquired using a density evolution analysis algorithm for a parity-check matrix and a given information length.

The LDPC encoder 1060 performs encoding based on the LDPC code shortened by the controller 1010 and the shortening pattern applier 1020.

Figure 11:
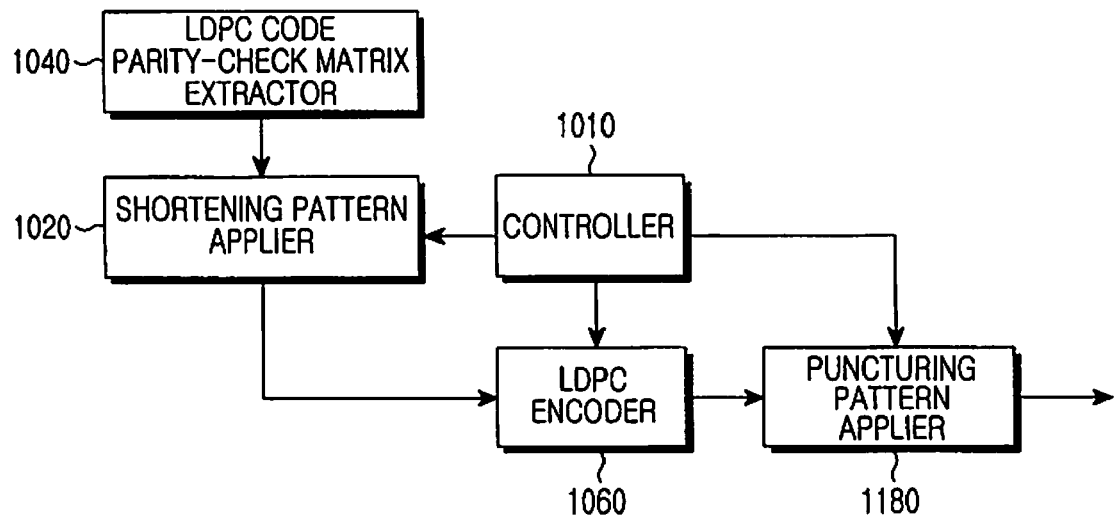
FIG. 11 illustrates a block diagram of a transmission apparatus using a proposed shortened/punctured LDPC code according to an embodiment of the present invention.

FIG. 11 illustrates a block diagram of a transmission apparatus for a DVB-S2 LDPC code using both shortening and puncturing. More specifically, the transmission apparatus of FIG. 11 also includes a puncturing pattern applier 1180 when compared to the transmission apparatus of FIG. 10.

Referring to FIG. 11, shortening is performed at an input stage of the LDPC encoder 1060, and puncturing is performed at an output stage of the LDPC encoder 1060. The puncturing pattern applier 1180 applies puncturing to an output of the LDPC encoder 1060. The method of applying puncturing has been described above in step 915 of FIG. 9.

Figure 12:
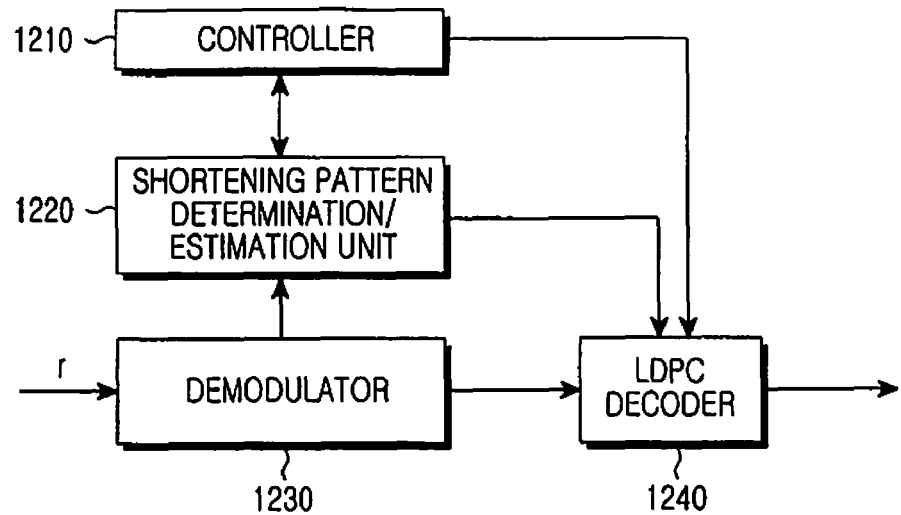
FIG. 12 illustrates a block diagram of a reception apparatus using an LDPC code to which proposed shortening is applied, according to an embodiment of the present invention.

FIG. 12 illustrates a block diagram of a reception apparatus using an LDPC code to which shortening is applied, according to an embodiment of the present invention. More specifically, FIG. 12 illustrates an example of a reception apparatus that receives a signal transmitted from a communication system using the shortened DVB-S2 LDPC code, and recovers user-desired data from the received signal when it detects a transmission modulation scheme and a length of the shortened DVB-S2 LDPC code from the received signal.

Referring to FIG. 12, the reception apparatus includes a controller 1210, a shortening pattern determination/estimation unit 1220, a demodulator 1230, and an LDPC decoder 1240. The demodulator 1230 receives and demodulates a shortened LDPC code, and provides the demodulated signal to the shortening pattern determination/estimation unit 1220 and the LDPC decoder 1240. The shortening pattern determination/estimation unit 1220, under the control of the controller 1210, estimates or determines information on a shortening pattern of an LDPC code from the demodulated signal, and provides position information of the shortened bits to the LDPC decoder 1240. Determining or estimating the shortening patterns in the shortening pattern determination/estimation unit 1220 can use shortening patterns stored in a memory, can generate shortening patterns using a sequence generator (not shown), or can obtain shortening patterns using a density evolution analysis algorithm for a parity-check matrix and a given information length.

The controller 1210 controls the shortening pattern determination/estimation unit 1220 to deliver a shortening pattern to the LDPC decoder 1240 depending on the modulation scheme and the information length. Because the probability that values of the shortened bits will be zero is 1 (i.e., 100%), the LDPC decoder 1240 determines whether or not it will allow the shortened bits to take part in its decoding operation depending on the value 1 of the probability that the shortened bits would be zero.

When the LDPC decoder 1240 receives information on a length of the DVB-S2 LDPC code shortened by the shortening pattern determination/estimation unit 1220, it restores the user-desired data from the received signals.

Figure 13:
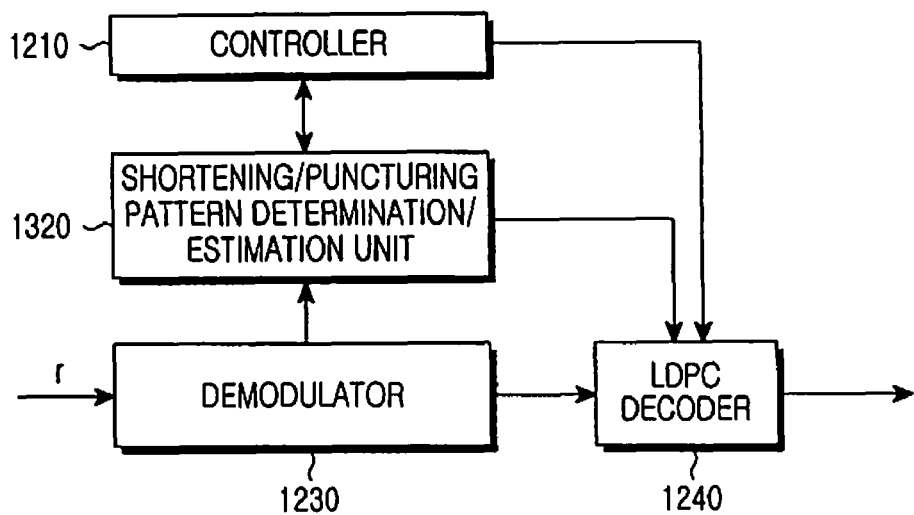
FIG. 13 illustrates a block diagram of a reception apparatus using an LDPC code to which proposed shortening and puncturing are both applied, according to an embodiment of the present invention.

FIG. 13 illustrates a block diagram of a reception apparatus using an LDPC code to which shortening and puncturing are applied, according to an embodiment of the present invention. More specifically, the reception apparatus illustrated FIG. 13 includes a shortening/puncturing pattern determination/estimation unit 1320 that replaces the shortening pattern determination/estimation unit 1220 in the reception apparatus illustrated in FIG. 12.

Referring to FIG. 13, when both shortening and puncturing are applied in the transmission apparatus, the shortening/puncturing pattern determination/estimation unit 1320 in the reception apparatus may perform pattern determination or estimation on the shortening first, perform pattern determination or estimation on the puncturing first, or make pattern determination or estimation on both the shortening and puncturing.

The LDPC decoder 1240 should have information about both shortening and puncturing to perform decoding.

Figure 14:
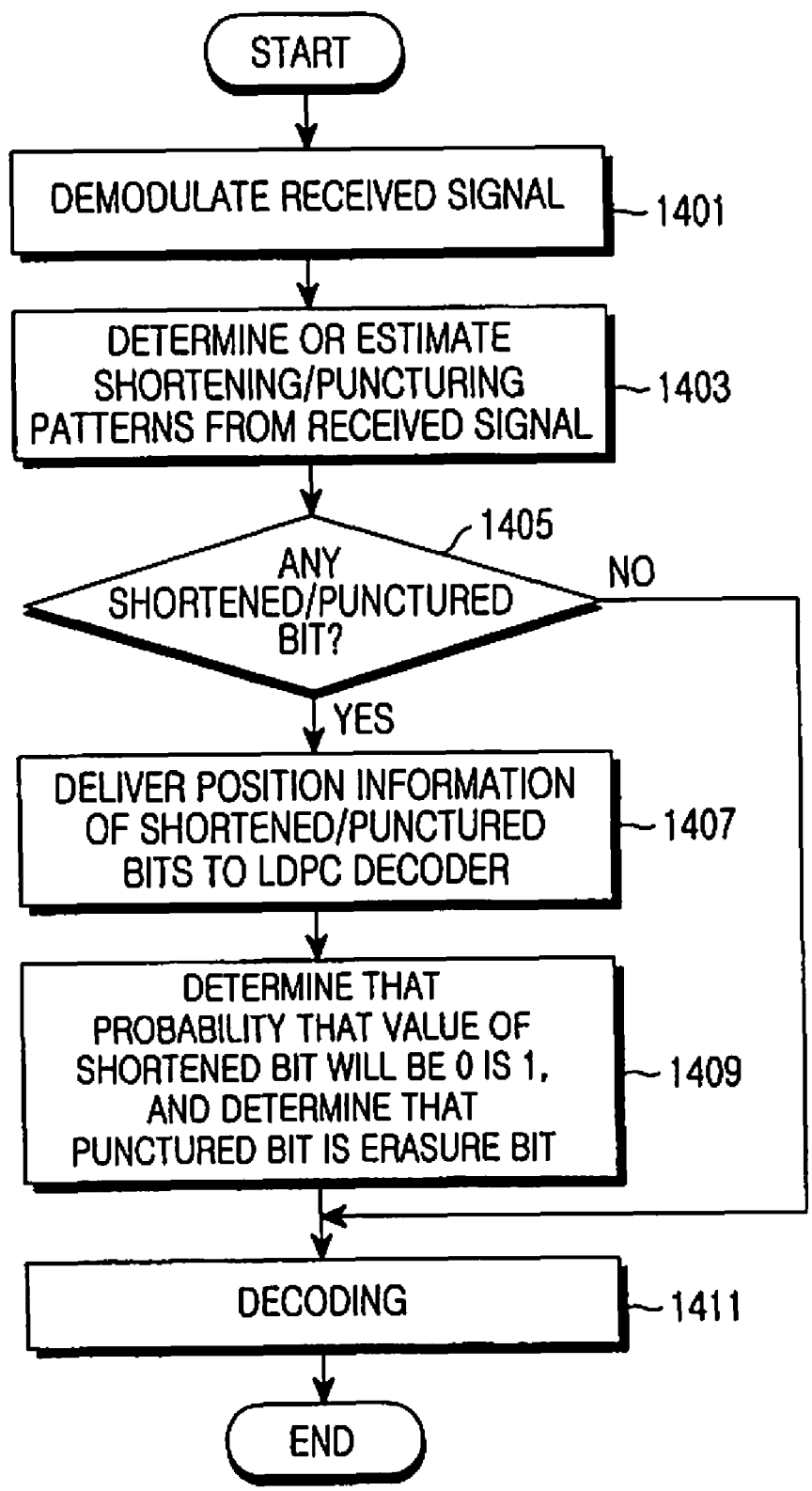
FIG. 14 illustrates a flowchart of a reception operation of a reception apparatus according to an embodiment of the present invention.

FIG. 14 illustrates a flowchart of a reception operation of a reception apparatus according to an embodiment of the present invention.

Referring to FIG. 14, a demodulator 1230 receives and demodulates a shortened LDPC code in step 1401. In step 1403, a shortening pattern determination/estimation unit 1220 determines or estimates shortening/puncturing patterns from the demodulated signal.

The shortening pattern determination/estimation unit 1220 determines in step 1405 whether there are any shortened or punctured bits. If there are no shortened or punctured bits, an LDPC decoder 1240 performs decoding in step 1411. However, if there are shortened or punctured bits, the shortening pattern determination/estimation unit 1220 delivers position information of the shortened/punctured bits to the LDPC decoder 1240 in step 1407.

In step 1409, based on the position information of the shortened/punctured bits, the LDPC decoder 1240 determines that the probability that values of the shortened bits will be 0 is 1, and determines that the punctured bits are erased bits. Thereafter, the LDPC decoder 1240 performs LDPC decoding in step 1411.

As is apparent from the foregoing description, the embodiments of the present invention can generate a separate LDPC code with a different codeword length using information on the parity-check matrix given in the communication system that uses high-order modulation and an LDPC code.

In addition, the embodiments of the present invention can perform shortening using different shortening patterns according to modulation schemes.

While the present invention has been shown and described with reference to certain embodiments thereof, it will be understood by those skilled in the art that various changes in form and details may be made therein without departing from the spirit and scope of the present invention as defined by the appended claims.

What is claimed is:

1. A method for encoding a channel using a Low-Density Parity-Check (LDPC) code in a communication system including a parity-check matrix extractor, a shortening pattern applier, and an LDPC encoder, the method comprising:

determining a modulation scheme for transmitting a symbol;

determining a shortening pattern in consideration of the determined modulation scheme;

grouping columns corresponding to an information word in a parity-check matrix of the LDPC code into a plurality of column groups;

ordering the column groups;

determining a range of a resulting information word desired to be obtained by shortening the information word;

based on the range of the resulting information word, performing, column group-by-column group shortening on the ordered column groups of the information word, according to the determined shortening pattern; and LDPC-encoding the shortened information word.

2. The method of claim 1, wherein reliabilities of bits included in a modulation symbol and a degree of a variable node are considered in determining the shortening pattern.

3. The method of claim 1, wherein when the LDPC code has a codeword length of 16200 and an information length of 7200 shortening is performed using one of a plurality of shortening patterns as shown below:

| Relationship between permutation functions suboptimized on BPSK/QPSK (2) | | | | | | | | | |
|---|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 3 | 2 | 7 | 6 | 5 | 1 | 19 | 0 |

| Relationship between permutation functions suboptimized on 16QAM (2) | | | | | | | | | |
|---|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(0)$ |
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 7 | 3 | 2 | 1 | 6 | 5 | 19 | 0 |

| Relationship between permutation functions suboptimized on 64QAM (2) | | | | | | | | | |
|---|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
| 18 | 17 | 16 | 4 | 15 | 14 | 13 | 12 | 3 | 11 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 10 | 9 | 2 | 8 | 7 | 1 | 6 | 5 | 19 | 0 | where $\pi$ denotes a permutation function indicating the shortening pattern.

4. The method of claim 1, wherein when the modulation scheme is 16-QAM, a codeword length is 16200 and an information length is 7200, a sequence of shortened information column groups is 18, 17, 16, 15, 14, 13, 12, 11, 4, 10, 9, 8, 7, 3, 2, 1, 6, 5, 19, and 0.

5. The method of claim 1, wherein when the modulation scheme is 64-QAM, a codeword length is 16200 and an information length is 7200, a sequence of shortened information column groups is 18, 17, 16, 4, 15, 14, 13, 12, 3, 11, 10, 9, 2, 8, 7, 1, 6, 5, 19, and 0.

6. The method of claim 1, further comprising:

performing, shortening additional columns from the shortened LDPC code when resulting information word is not equal to the information word shortened by column group-by column group shortening.

7. The method of claim 6, further comprising:

the additional shortening is performed from the rear or the front of the column group where the additional shortening is achieved.

8. A method for encoding a channel using a Low-Density Parity-Check (LDPC) code in a communication system including a parity-check matrix extractor, a shortening pattern applier, and an LDPC encoder, the method comprising:

performing, by the shortening pattern applier, column group-by-column group shortening according to the shortening patterns as shown below, wherein when the modulation scheme is 16QAM:

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(0)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 7 | 3 | 2 | 1 | 6 | 5 | 19 | 0 | where $\pi$ denotes a permutation function.

9. The method of claim 8, wherein reliabilities of bits included in a modulation symbol and a degree of a variable node are considered in determining the shortening pattern.

10. A method for encoding a channel using a Low-Density Parity-Check (LDPC) code in a communication system including a parity-check matrix extractor, a shortening pattern applier, and an LDPC encoder, the method comprising:

performing, by the shortening pattern applier, column group-by-column group shortening according to the shortening patterns as shown below, wherein when the modulation scheme is 64QAM:

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 4 | 15 | 14 | 13 | 12 | 3 | 11 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 10 | 9 | 2 | 8 | 7 | 1 | 6 | 5 | 19 | 0 | where $\pi$ denotes a permutation function.

11. The method of claim 10, wherein reliabilities of bits included in a modulation symbol and a degree of a variable node are considered in determining the shortening pattern.

12. An apparatus for encoding a channel in a communication system using a Low-Density Parity-Check (LDPC) code, the apparatus comprising:

a parity-check matrix extractor for extracting the LDPC parity-check matrix for shortening;

a shortening pattern applier for based on the range of a resulting information word, performing column group-by-column group shortening on the ordered column groups of the information word according to a shortening pattern determined in consideration of the determined modulation scheme; and an LDPC encoder for LDPC-encoding the shortened information word.

13. The apparatus of claim 12, wherein reliabilities of bits included in a modulation symbol and a degree of a variable node are considered in determining the shortening pattern.

14. The apparatus of claim 12, wherein when the LDPC code has a codeword length of 16200and an information length of 7200the shortening pattern is determined from one of a plurality of shortening patterns as defined by:

| Relationship between permutation functions suboptimized on BPSK/QPSK (2) | | | | | | | | | |
|---|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 3 | 2 | 7 | 6 | 5 | 1 | 19 | 0 |
| Relationship between permutation functions suboptimized on 16QAM (2) | | | | | | | | | |
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(0)$ |
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 7 | 3 | 2 | 1 | 6 | 5 | 19 | 0 |
| Relationship between permutation functions suboptimized on 64QAM (2) | | | | | | | | | |
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
| 18 | 17 | 16 | 4 | 15 | 14 | 13 | 12 | 3 | 11 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 10 | 9 | 2 | 8 | 7 | 1 | 6 | 5 | 19 | 0 | where $\pi$ denotes a permutation function that indicates the shortening pattern.

15. The apparatus of claim 12, wherein when the modulation scheme is 16-QAM, a codeword length is 16200and an information length is 7200, a sequence of shortened information column groups is 18, 17, 16, 15, 14, 13, 12, 11, 4, 10, 9, 8, 7, 3, 2, 1, 6, 5, 19, and 0.

16. The apparatus of claim 12, wherein when the modulation scheme is 64-QAM, a codeword length is 16200and an information length is 7200, a sequence of shortened information column groups is 18, 17, 16, 4, 15, 14, 13, 12, 3, 11, 10, 9, 2, 8, 7, 1, 6, 5, 19, and 0.

17. The apparatus of claim 12, wherein the shortening pattern applier performs shortening additional columns from the shortened LDPC code when resulting information word is not equal to the information word shortened by column group-by column group shortening.

18. The apparatus of claim 12, wherein the additional shortening is performed from the rear or the front of the column group where the additional shortening is achieved.

19. An apparatus for encoding a channel using a Low-Density Parity-Check (LDPC) code in a communication system including a parity-check matrix extractor, a shortening pattern applier, and an LDPC encoder, the apparatus comprising:
the shortening pattern applier for performing column group-by-column group shortening according to the shortening patterns as shown below, wherein when the modulation scheme is 16QAM:

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(0)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 7 | 3 | 2 | 1 | 6 | 5 | 19 | 0 | where $\pi$ denotes a permutation function.

20. An apparatus for encoding a channel in a communication system using a Low-Density Parity-Check (LDPC) code, the apparatus comprising:
a parity-check matrix extractor for determining a modulation scheme for transmitting a symbol, grouping columns corresponding to an information word in a parity-check matrix of the LDPC code into a plurality of column groups, and ordering the column groups;
a shortening pattern applier for determining a range of a resulting information word desired to be obtained by shortening the information word, and based on the range of the resulting information word, performing column group-by-column group shortening on the ordered column groups of the information word according to a shortening pattern determined in consideration of the determined modulation scheme; and
an LDPC encoder for LDPC-encoding the shortened information word;
wherein when the modulation scheme is 64-QAM, a codeword length is 16200, and an information length is 7200, the shortening pattern defined by:

| Relationship between permutation functions suboptimized on 64QAM (2) | | | | | | | | | |
|---|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
| 18 | 17 | 16 | 4 | 15 | 14 | 13 | 12 | 3 | 11 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 10 | 9 | 2 | 8 | 7 | 1 | 6 | 5 | 19 | 0 | where $\pi$ denotes a permutation function that indicates the shortening pattern.

21. A method for encoding a channel using a Low-Density Parity-Check (LDPC) code in a communication system including a parity-check matrix extractor, a shortening pattern applier, and an LDPC encoder, the method comprising:
determining a modulation scheme for a transmission symbol;
performing shortening on an information word in a parity-check matrix of the LDPC code using a different shortening pattern according to the determined modulation scheme; and
LDPC-encoding the shortened information word;
wherein the different shortening pattern includes shortening patterns defined by:

| Relationship between permutation functions suboptimized on BPSK/QPSK (2) | | | | | | | | | |
|---|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 3 | 2 | 7 | 6 | 5 | 1 | 19 | 0 |

-continued

Relationship between permutation functions suboptimized on 16QAM (2)

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(0)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 7 | 3 | 2 | 1 | 6 | 5 | 19 | 0 |

Relationship between permutation functions suboptimized on 64QAM (2)

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 4 | 15 | 14 | 13 | 12 | 3 | 11 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 10 | 9 | 2 | 8 | 7 | 1 | 6 | 5 | 19 | 0 | where $\pi$ denotes a permutation function that indicates the shortening pattern.

22. The method of claim 21, wherein reliabilities of bits included in a modulation symbol and a degree of a variable node are considered in determining the shortening pattern.

23. The method of claim 21, wherein when the modulation scheme is 16-QAM, a codeword length is 16200, and an information length is 7200, a sequence of shortened information column groups is 18, 17, 16, 15, 14, 13, 12, 11, 4, 10, 9, 8, 7, 3, 2, 1, 6, 5, 19, and 0.

24. The method of claim 21, wherein when the modulation scheme is 64-QAM, a codeword length is 16200, and an information length is 7200, a sequence of shortened information column groups is 18, 17, 16, 4, 15, 14, 13, 12, 3, 11, 10, 9, 2, 8, 7, 1, 6, 5, 19, and 0.

25. A method for decoding a channel using a Low-Density Parity-Check (LDPC) code in a communication system including a shortening pattern estimator and a decoder, the method comprising:
 demodulating a signal transmitted from a transmitter;
 determining whether there is at least one shortened bit in the demodulated signal;
 when there is at least one shortened bit, determining a position of the at least one shortened bit by estimating information about a shortening pattern; and
 decoding data using the determined position of the shortened bit;
 wherein the shortening pattern is determined in consideration of a modulation scheme.

26. The method of claim 25, wherein reliabilities of bits included in a modulation symbol and a degree of a variable node are considered in determining the shortening pattern.

27. The method of claim 25, wherein when the modulation scheme is 16-QAM, a cod eword length is 16200, and an information length is 7200, position values of shortened information bits include 18, 17, 16, 15, 14, 13, 12, 11, 4, 10, 9, 8, 7, 3, 2, 1, 6, 5, 19, and 0.

28. The method of claim 25, wherein the modulation scheme is 64-QAM, a codeword length is 16200, and an information length is 7200, position values of shortened information bits include 18, 17, 16, 4, 15, 14, 13, 12, 3, 11, 10, 9, 2, 8, 7, 1, 6, 5, 19, and 0.

29. A method for decoding a channel using a Low-Density Parity-Check (LDPC) code in a communication system including a shortening pattern estimator and a decoder, the method comprising:
 decoding, by the decoder, data using the determined position of the shortened bit based on a shortening pattern;
 wherein the shortening pattern is determined in consideration of a modulation scheme, and when the modulation scheme is 16-QAM, a codeword length is 16200, and an information length is 7200, the shortening pattern is defined by:

Relationship between permutation functions suboptimized on 16QAM (2)

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(0)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 7 | 3 | 2 | 1 | 6 | 5 | 19 | 0 | where $\pi$ denotes a permutation function.

30. A method for decoding a channel using a Low-Density Parity-Check (LDPC) code in a communication system including a shortening pattern estimator and a decoder, the method comprising:
 decoding, by the decoder, data using the determined position of the shortened bit based on a shortening pattern;
 wherein the shortening pattern is determined in consideration of a modulation scheme, and when the modulation scheme is 64-QAM, a codeword length is 16200, and an information length is 7200, the shortening pattern is defined by:

Relationship between permutation functions suboptimized on 64QAM (2)

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 4 | 15 | 14 | 13 | 12 | 3 | 11 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 10 | 9 | 2 | 8 | 7 | 1 | 6 | 5 | 19 | 0 | where $\pi$ denotes a permutation.

31. An apparatus for decoding a channel in a communication system using a Low-Density Parity-Check (LDPC) code, the apparatus comprising:
 a shortening pattern estimator for determining a position of the at least one shortened bit by estimating information about a shortening pattern; and
 a decoder for decoding data using the determined position of the shortened bit;
 wherein the shortening pattern is determined in consideration of a modulation scheme.

32. The apparatus of claim 31, wherein reliabilities of bits included in a modulation symbol and a degree of a variable node are considered in determining the shortening pattern.

33. The apparatus of claim 31, wherein when the LDPC code has a codeword length of 16200 and an information length of 7200, the shortening pattern is selected from a plurality of different shortening patterns defined by:

Relationship between permutation functions suboptimized on BPSK/QPSK (2)

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 15 | 14 | 13 | 12 | 11 | 4 | 10 |

-continued

| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
|---|---|---|---|---|---|---|---|---|---|
| 9 | 8 | 3 | 2 | 7 | 6 | 5 | 1 | 19 | 0 |

Relationship between permutation functions suboptimized on 16QAM (2)

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(0)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 7 | 3 | 2 | 1 | 6 | 5 | 19 | 0 |

Relationship between permutation functions suboptimized on 64QAM (2)

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 4 | 15 | 14 | 13 | 12 | 3 | 11 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 10 | 9 | 2 | 8 | 7 | 1 | 6 | 5 | 19 | 0 | where $\pi$ denotes a permutation function that indicates the shortening pattern.

34. The apparatus of claim 31, wherein when the modulation scheme is 16-QAM, a codeword length is 16200, and an information length is 7200, position values of shortened information bits comprise 18, 17, 16, 15, 14, 13, 12, 11, 4, 10, 9, 8, 7, 3, 2, 1, 6, 5, 19, and 0.

35. The apparatus of claim 31, wherein the modulation scheme is 64-QAM, a codeword length is 16200, and an information length is 7200, position values of shortened information bits comprise 18, 17, 16, 4, 15, 14, 13, 12, 3, 11, 10, 9, 2, 8, 7, 1, 6, 5, 19, and 0.

36. An apparatus for decoding a channel in a communication system using a Low-Density Parity-Check (LDPC) code, the apparatus comprising:
a decoder for decoding data using the determined position of the shortened bit based on a shortening pattern;
wherein the shortening pattern determined in consideration of a modulation scheme, and when the modulation scheme is 16-QAM, a codeword length is 16200, and an information length is 7200, the shortening pattern defined by:

Relationship between permutation functions suboptimized on 16QAM (2)

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(0)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 7 | 3 | 2 | 1 | 6 | 5 | 19 | 0 | where $\pi$ denotes a permutation function.

37. An apparatus for decoding a channel in a communication system using a Low-Density Parity-Check (LDPC) code, the apparatus comprising:
a decoder for decoding data using the determined position of the shortened bit based on a shortening pattern;
wherein the shortening pattern determined in consideration of a modulation scheme, and when the modulation scheme is 64-QAM, a codeword length is 16200, and an information length is 7200, the shortening pattern defined by:

Relationship between permutation functions suboptimized on 64QAM (2)

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 4 | 15 | 14 | 13 | 12 | 3 | 11 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 10 | 9 | 2 | 8 | 7 | 1 | 6 | 5 | 19 | 0 | where $\pi$ denotes a permutation function.

\* \* \* \* \*